(12) United States Patent
Cheng et al.

(10) Patent No.: US 12,300,719 B2
(45) Date of Patent: May 13, 2025

(54) STRUCTURE AND FORMATION METHOD OF SEMICONDUCTOR DEVICE WITH ISOLATION STRUCTURE

(71) Applicant: Taiwan Semiconductor Manufacturing Company, Ltd., Hsinchu (TW)

(72) Inventors: Jung-Chien Cheng, Tainan (TW); Kuo-Cheng Chiang, Zhubei (TW); Shi-Ning Ju, Hsinchu (TW); Guan-Lin Chen, Baoshan Township, Hsinchu County (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 461 days.

(21) Appl. No.: 17/886,689

(22) Filed: Aug. 12, 2022

(65) Prior Publication Data
US 2024/0055478 A1 Feb. 15, 2024

(51) Int. Cl.
*H01L 29/06* (2006.01)
*H01L 21/8234* (2006.01)
*H01L 29/423* (2006.01)
*H01L 29/66* (2006.01)
*H01L 29/775* (2006.01)
*H01L 29/786* (2006.01)

(52) U.S. Cl.
CPC .. *H01L 29/0673* (2013.01); *H01L 21/823412* (2013.01); *H01L 21/823431* (2013.01); *H01L 21/823481* (2013.01); *H01L 29/0649* (2013.01); *H01L 29/42392* (2013.01); *H01L 29/66439* (2013.01); *H01L 29/66545* (2013.01); *H01L 29/775* (2013.01); *H01L 29/78696* (2013.01)

(58) Field of Classification Search
CPC ......... H01L 29/0673; H01L 21/823431; H01L 29/42392; H01L 27/088
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |

(Continued)

*Primary Examiner* — Wasiul Haider
(74) *Attorney, Agent, or Firm* — Birch, Stewart, Kolasch & Birch, LLP

(57) ABSTRACT

A semiconductor device structure and a formation method are provided. The method includes forming a first fin structure and a second fin structure over a substrate. The method also includes forming a first metal gate stack wrapped around and extending across the first fin structure and the second fin structure. The method further includes forming a second metal gate stack wrapped around and extending across the first fin structure and the second fin structure. In addition, the method includes forming a protective structure extending into the first gate stack and forming a dielectric structure extending into the protective structure and the second metal gate stack. A portion of the protective structure is between the dielectric structure and the metal gate stack.

20 Claims, 27 Drawing Sheets

(56) References Cited

U.S. PATENT DOCUMENTS

| | | |
|---|---|---|
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2020/0105868 A1* | 4/2020 | Loubet ................ H01L 29/6681 |

* cited by examiner

STRUCTURE AND FORMATION METHOD OF SEMICONDUCTOR DEVICE WITH ISOLATION STRUCTURE

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
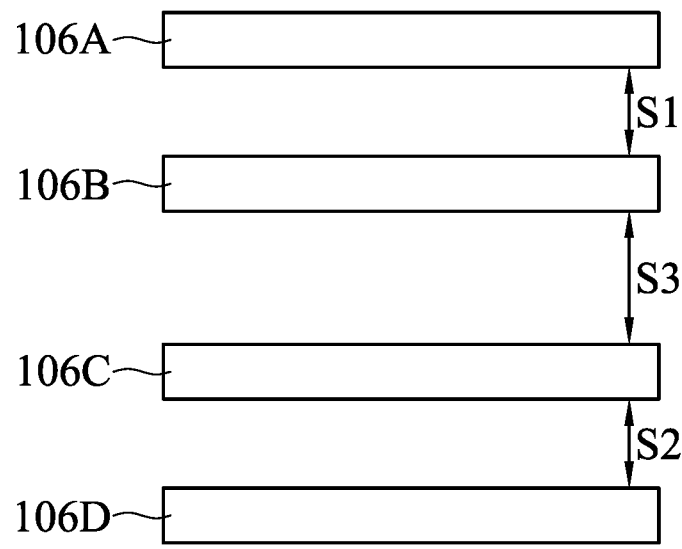
FIGS. 1A-1E are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may relate to FinFET structure having fins and/or gate all around (GAA) transistor structures (which include channel layers suspended over a substrate, where the channel layers are fabricated from semiconductor layers stacks (i.e., fins)). The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
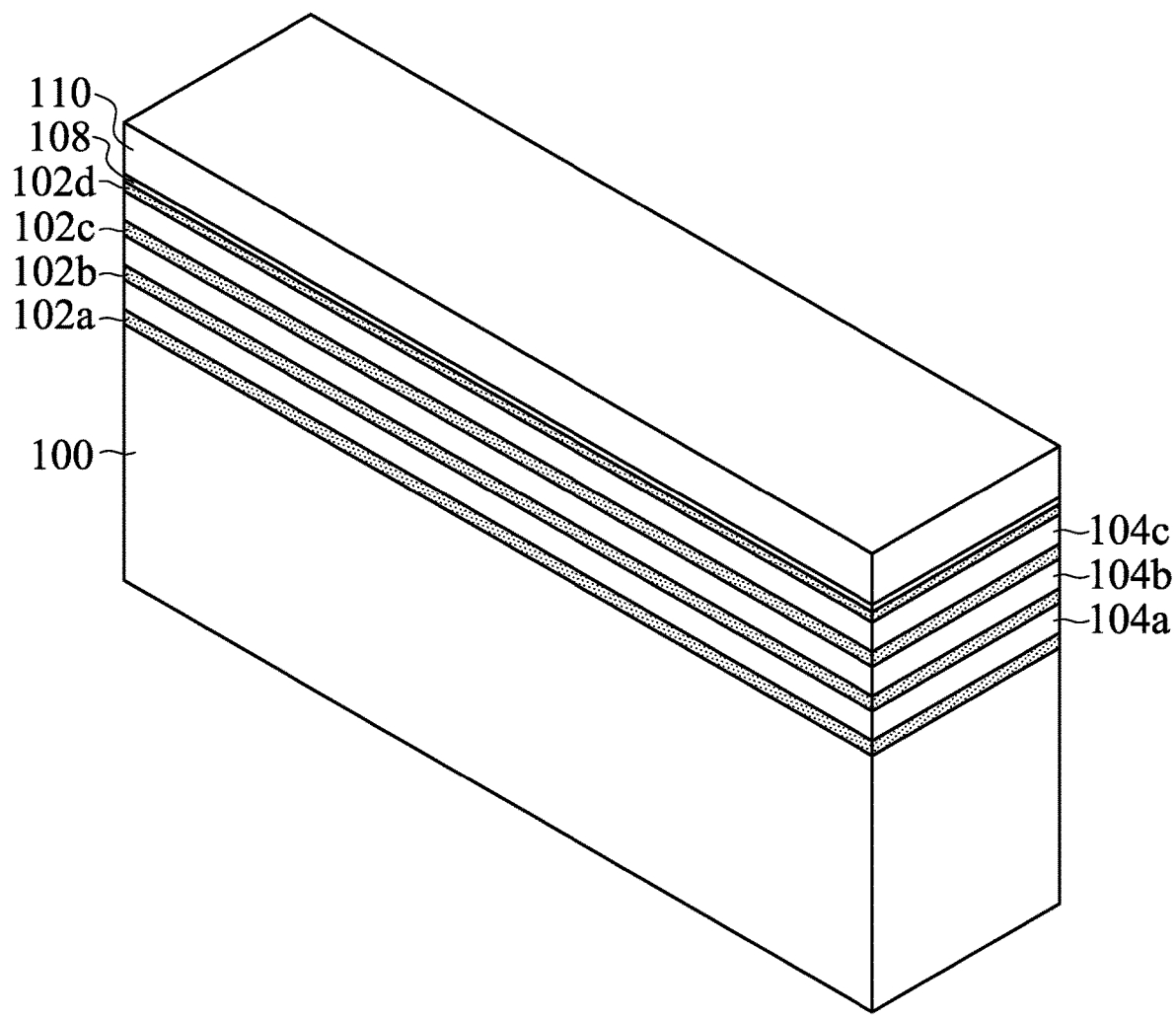
FIGS. 2A-2N are perspective views of various stages of a process for forming a portion of a semiconductor device structure, in accordance with some embodiments.
Figure 2B:
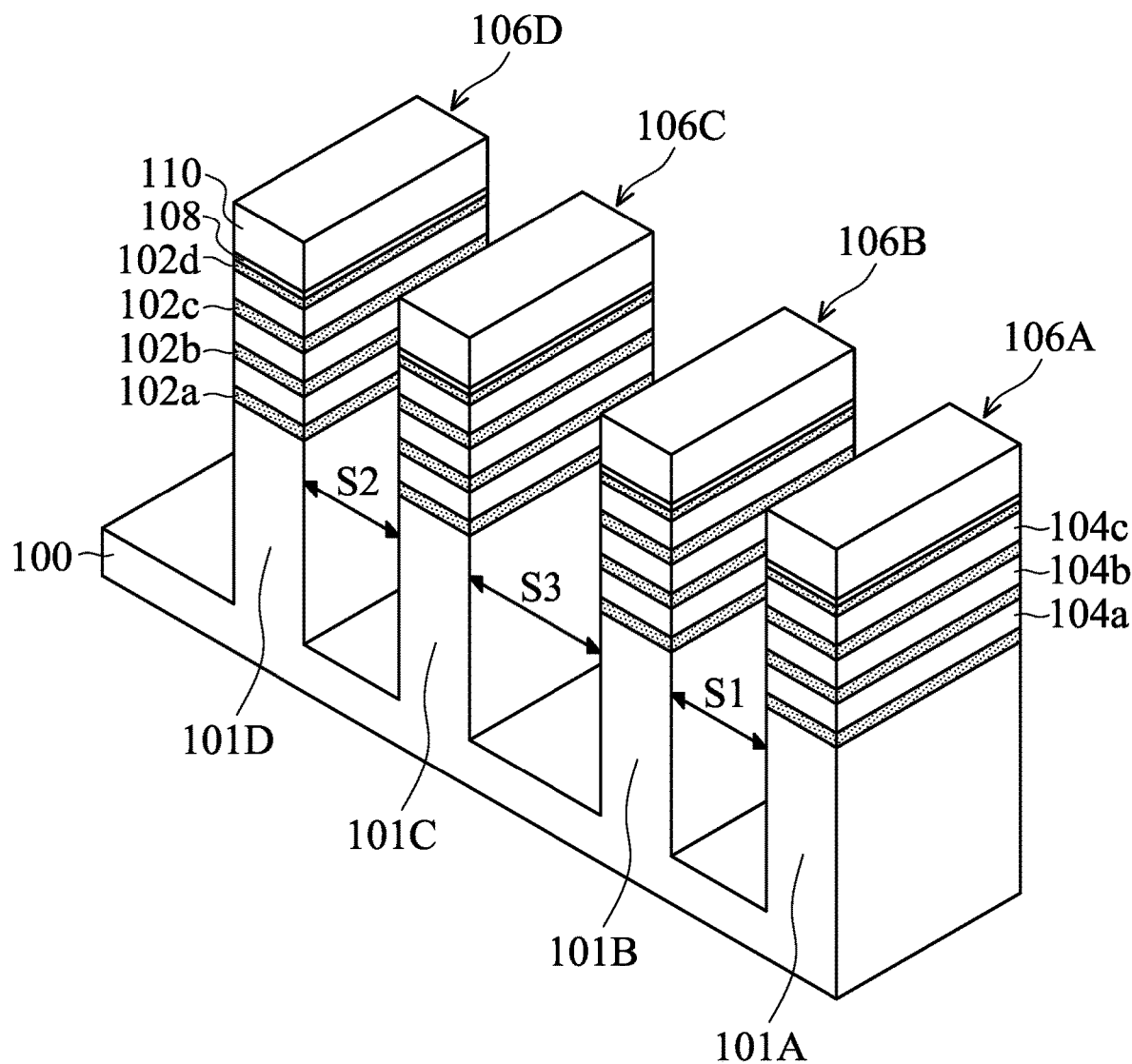
Figure 2C:
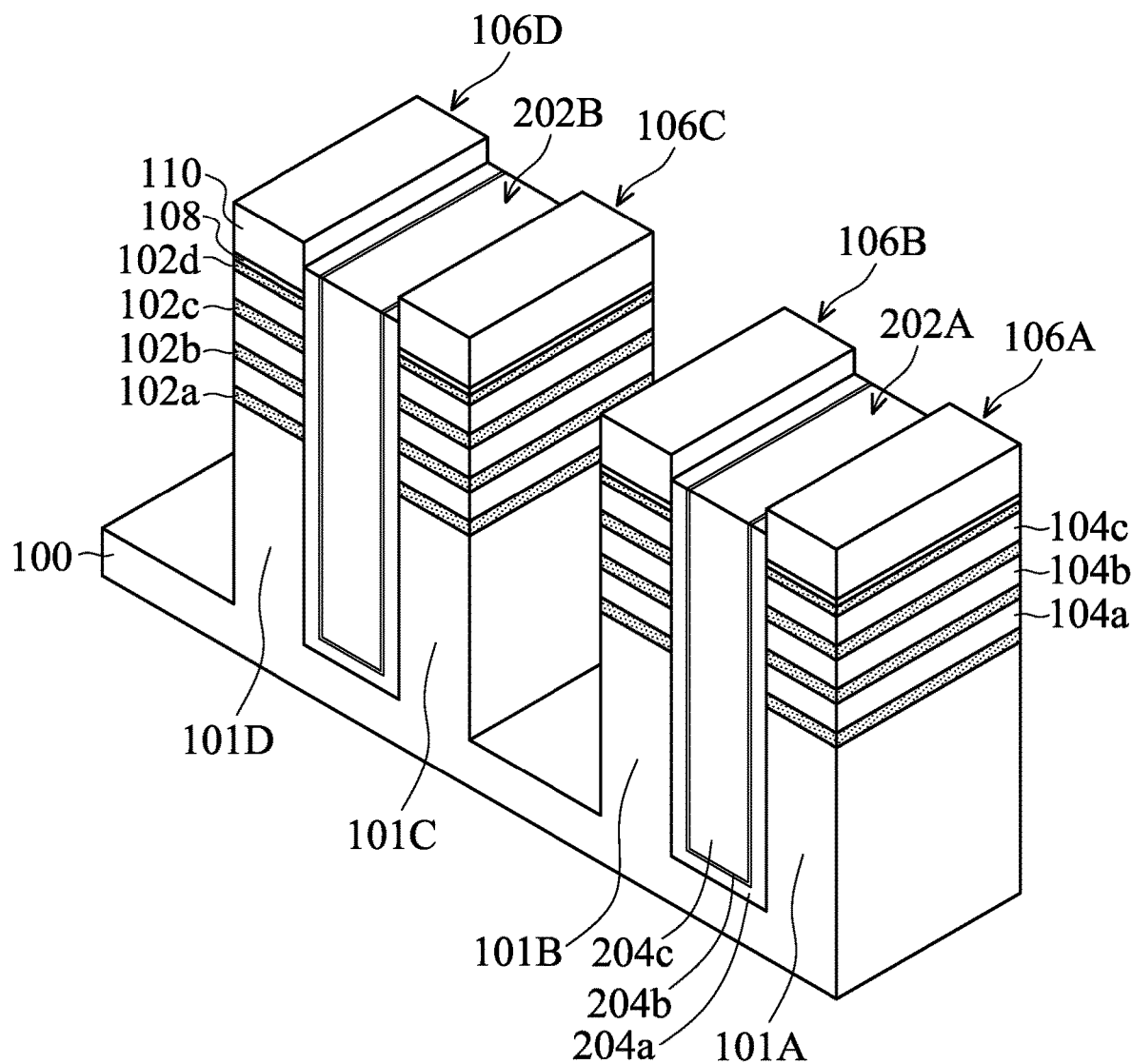
Figure 2D:
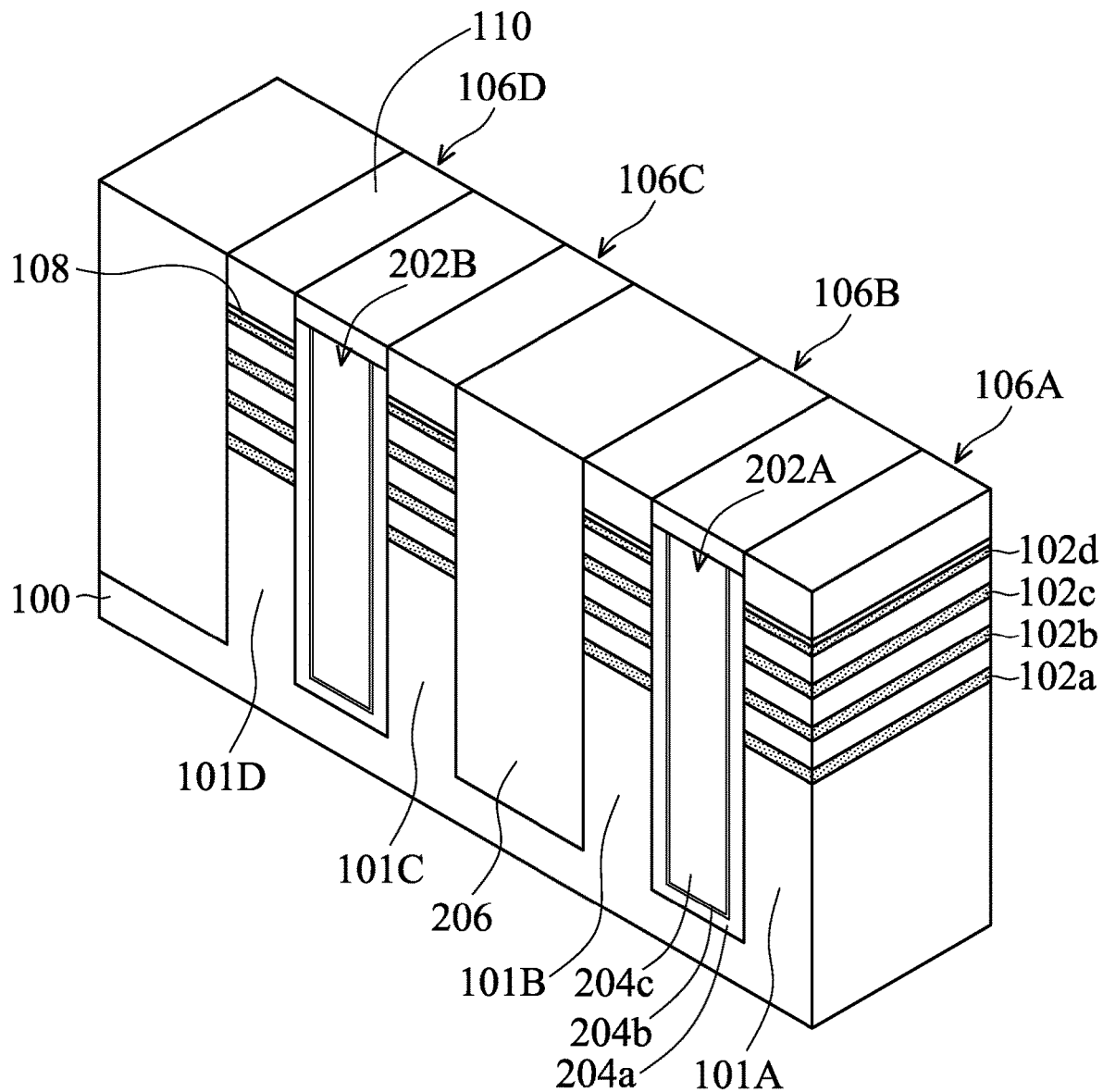
Figure 2E:
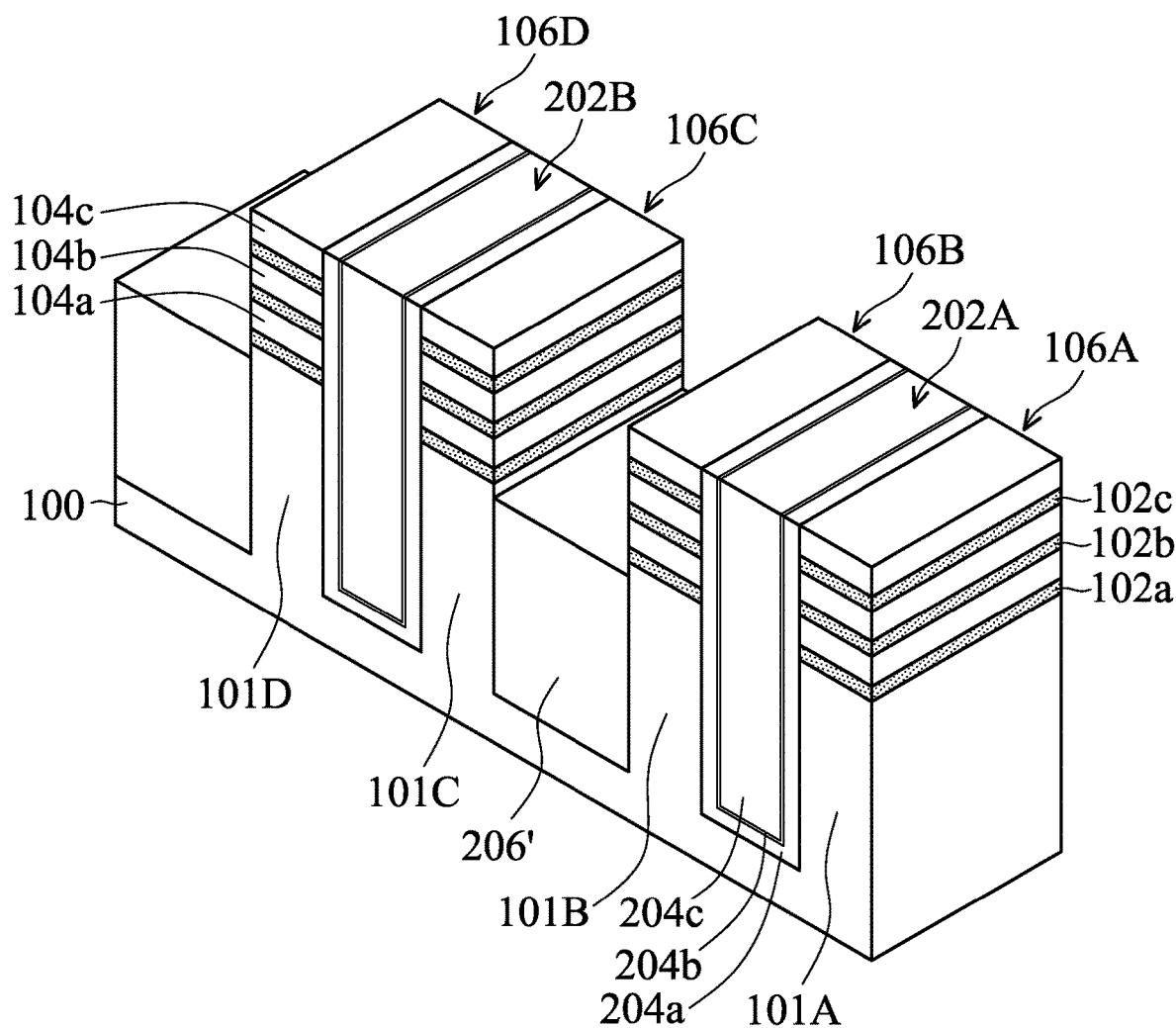
Figure 2F:
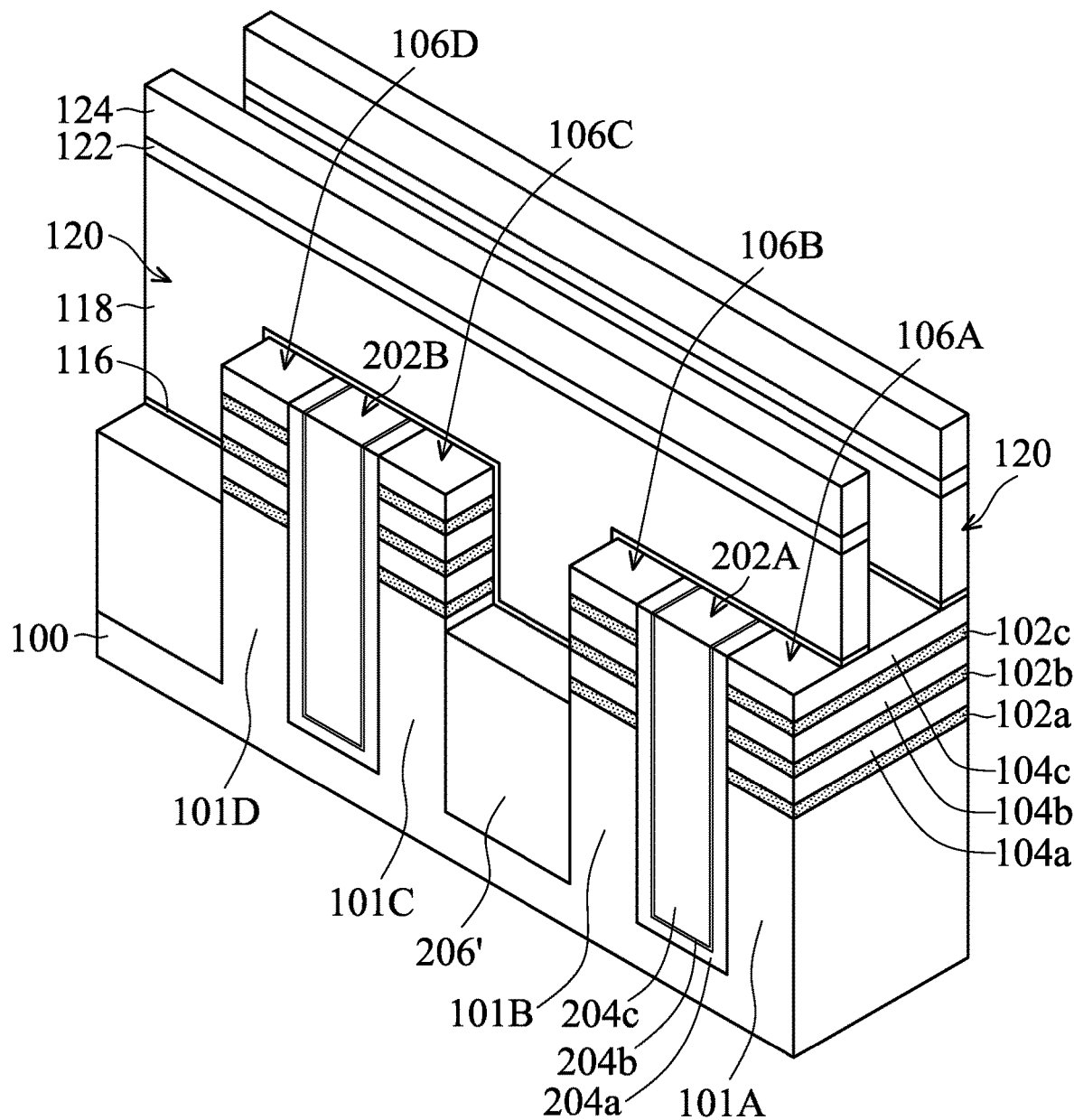
Figure 2G:
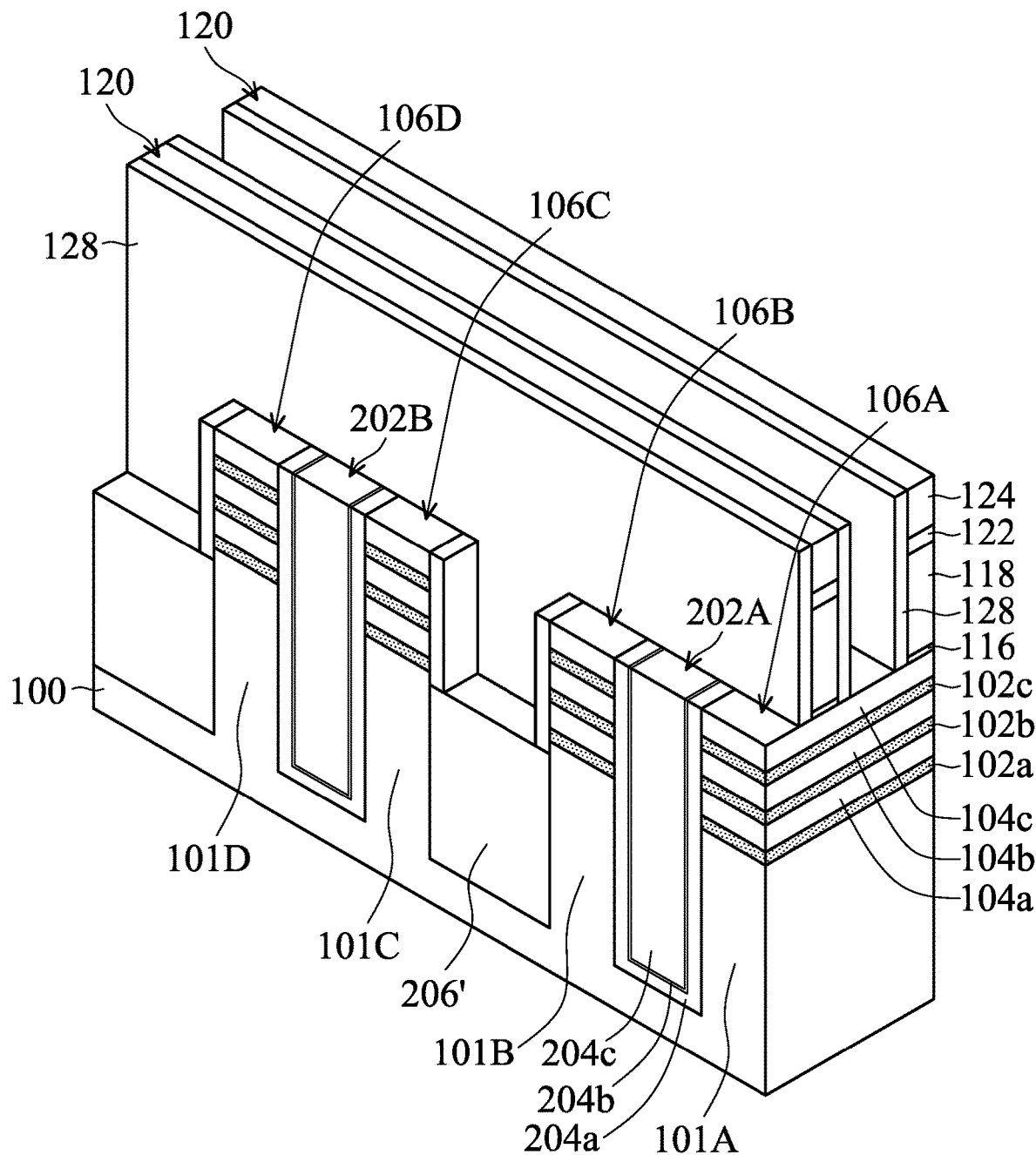
Figure 2H:
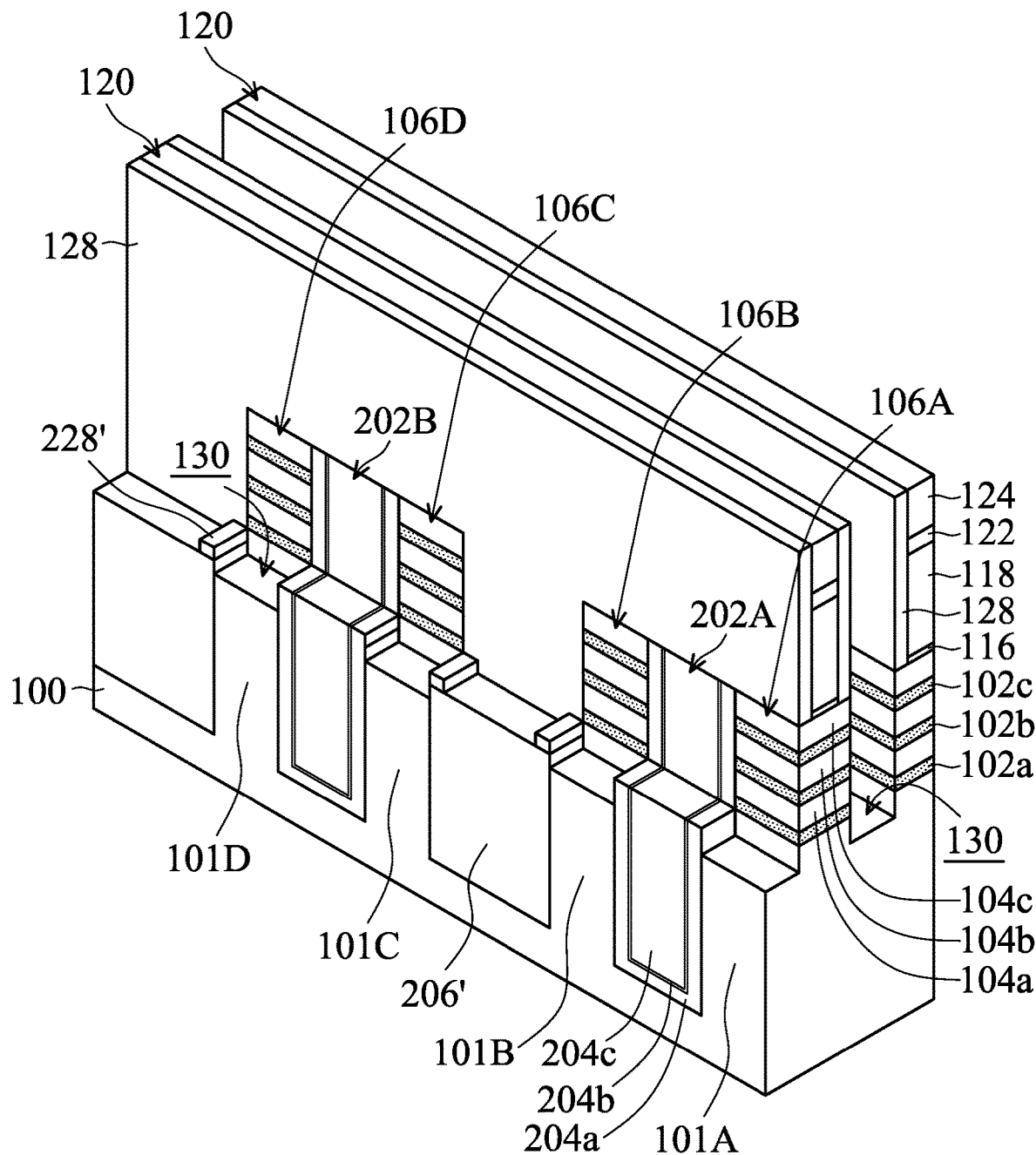
Figure 2I:
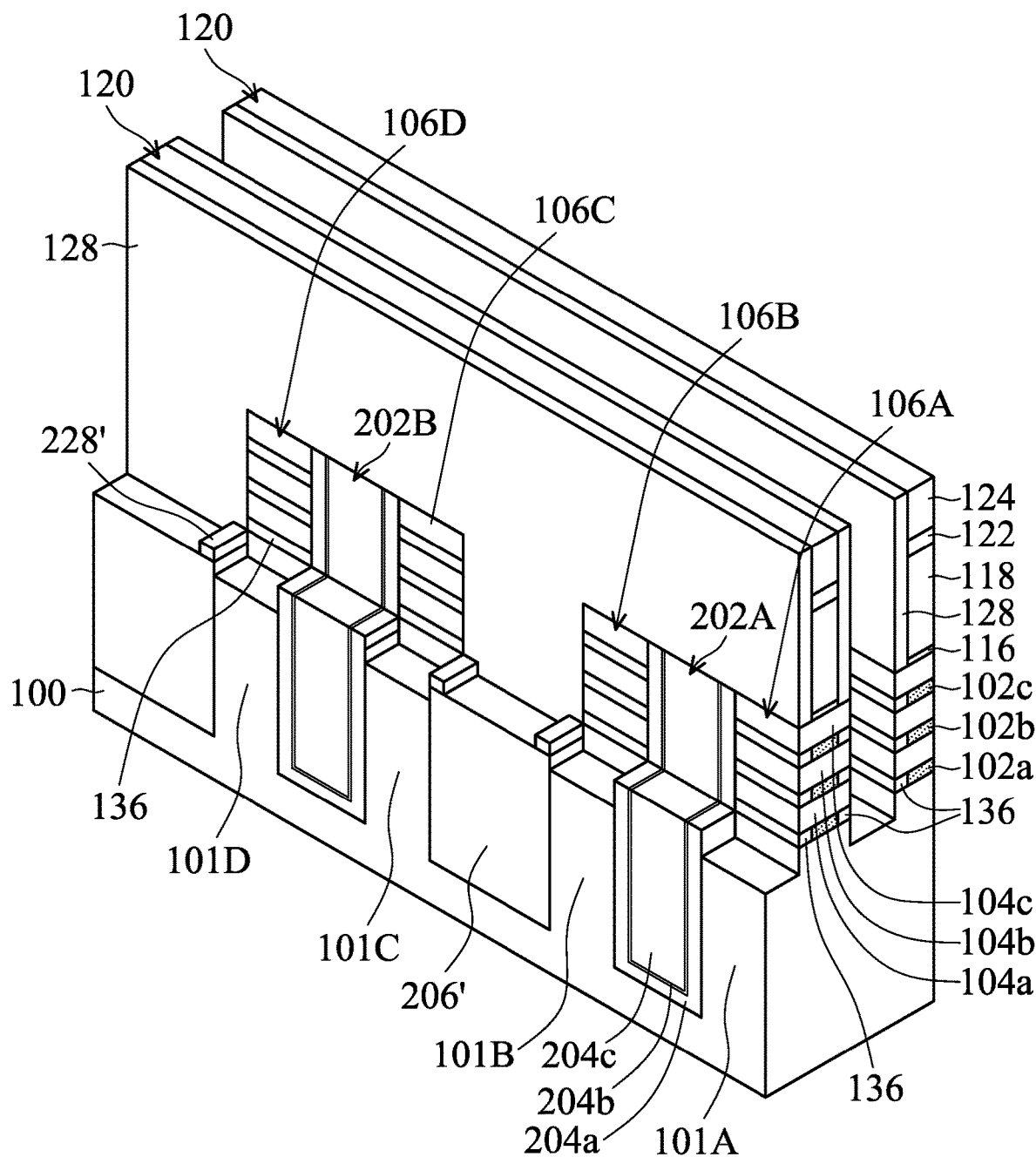
Figure 2J:
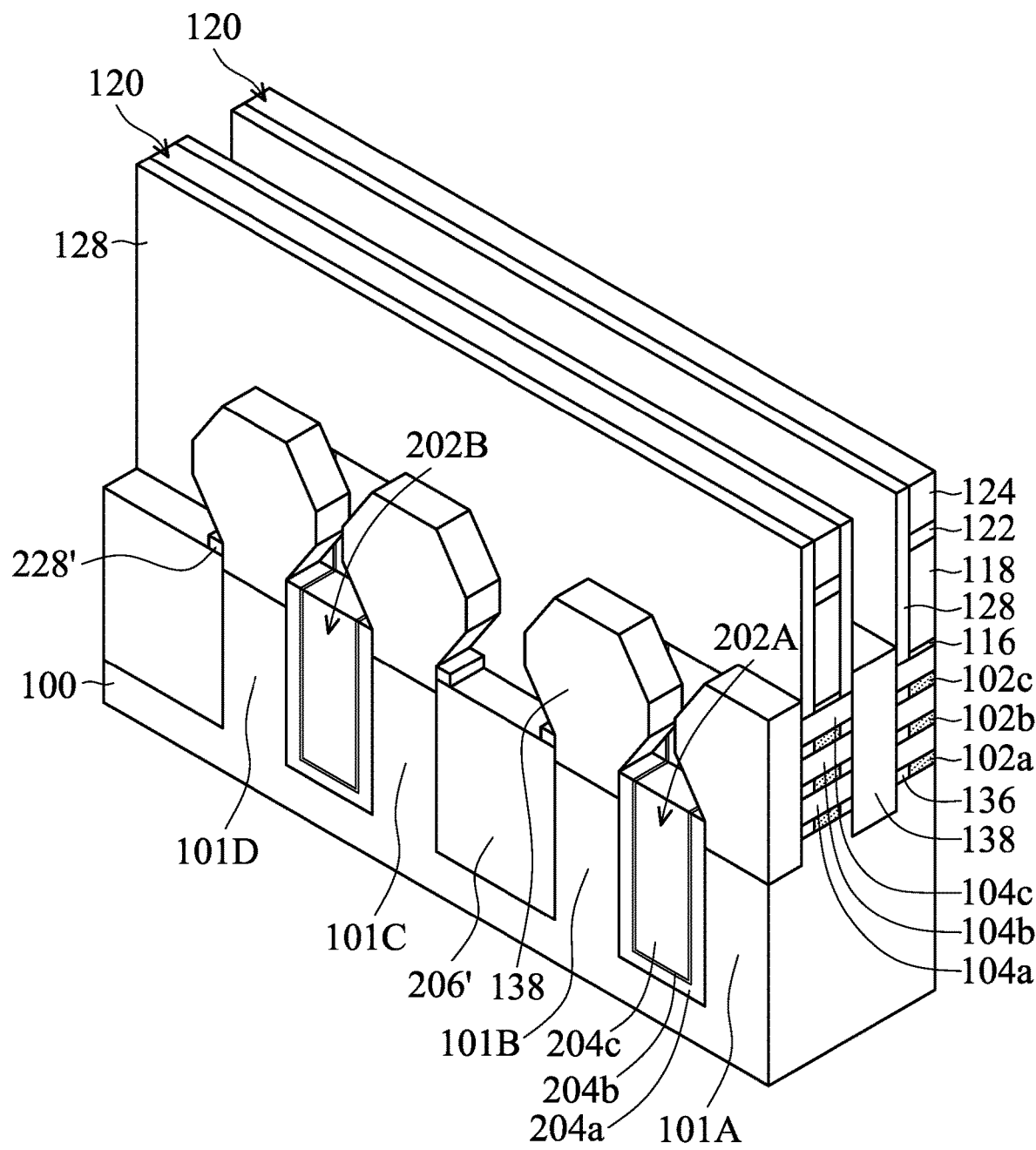
Figure 2K:
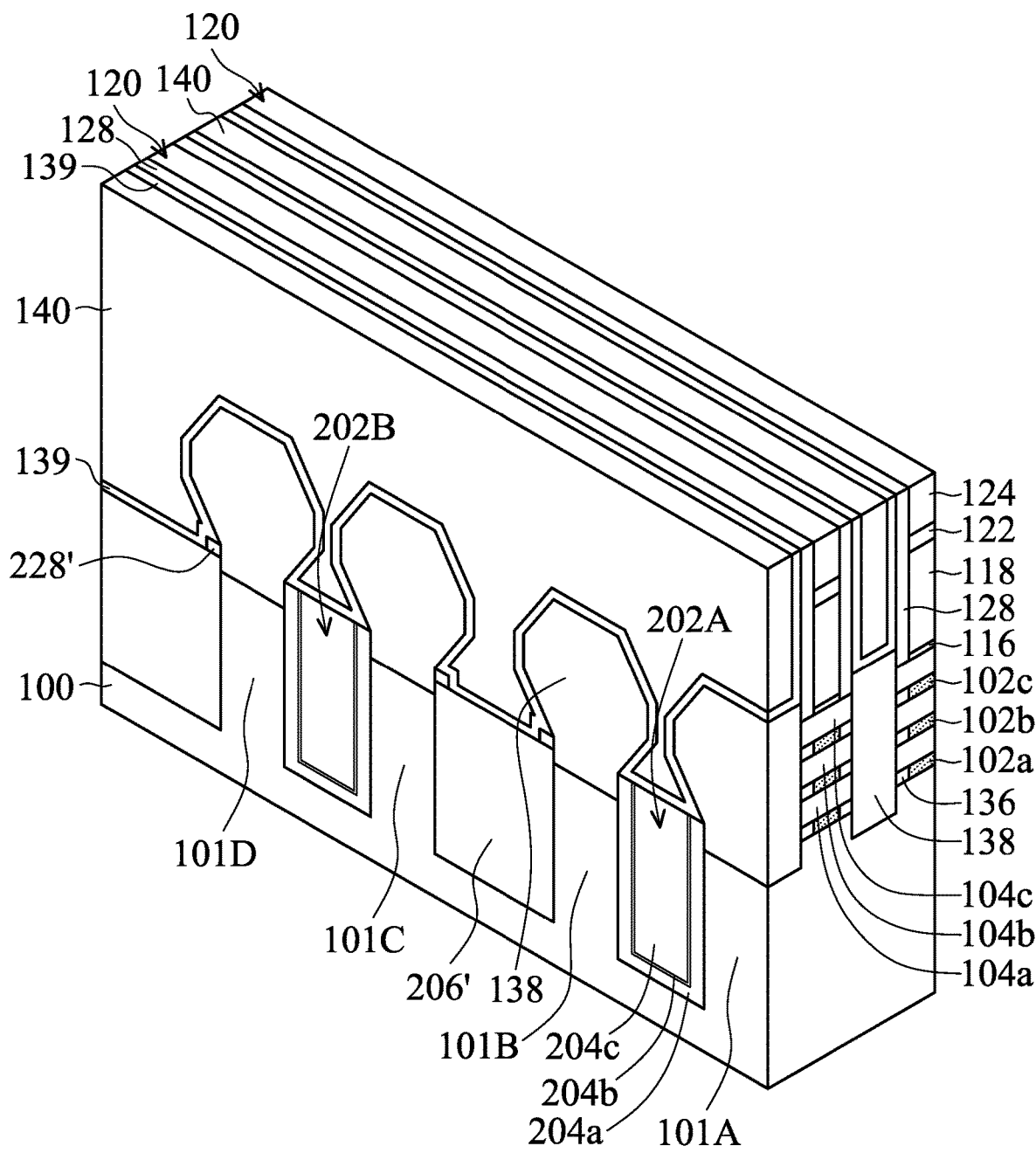
Figure 2L:
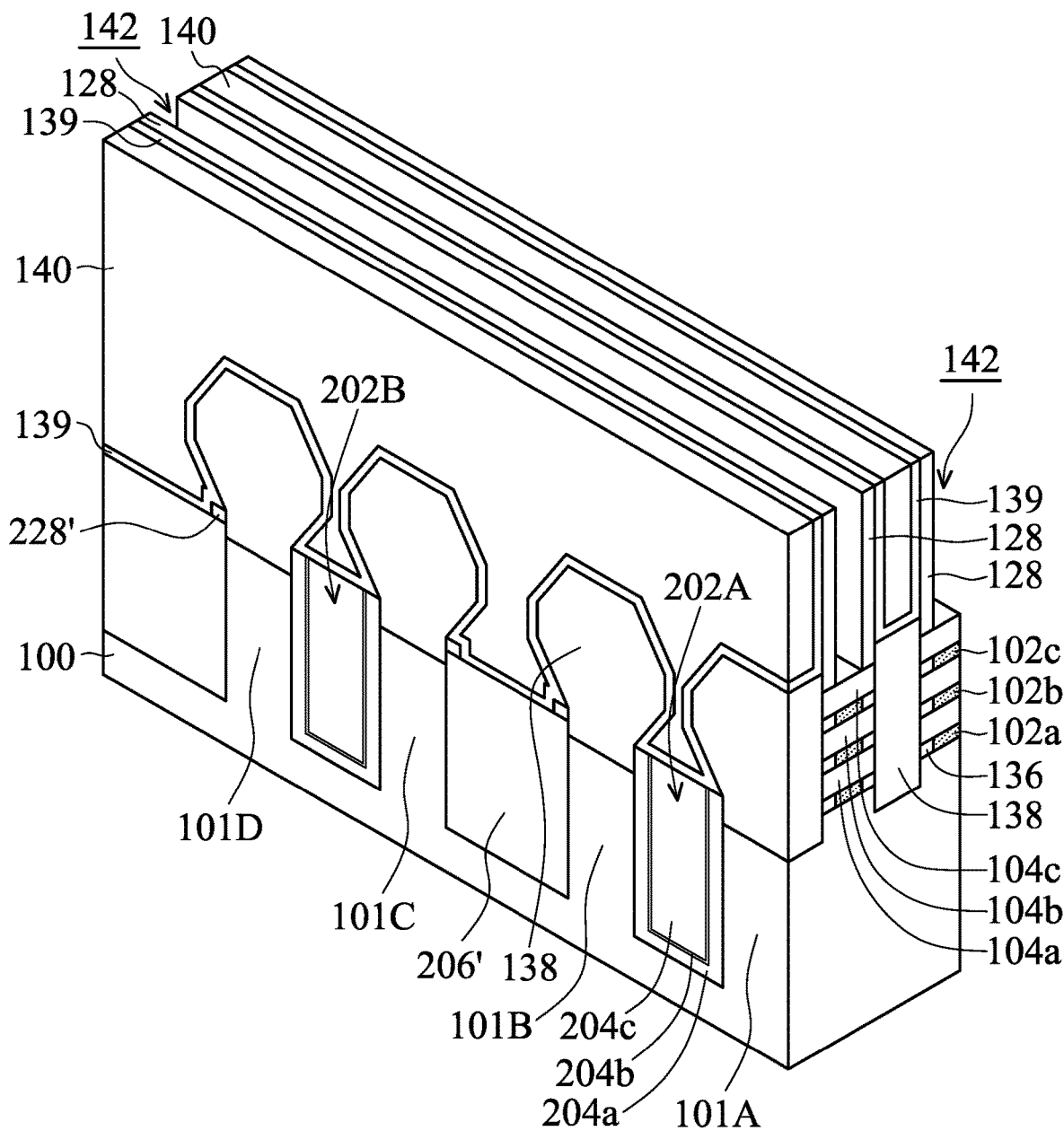
Figure 2M:
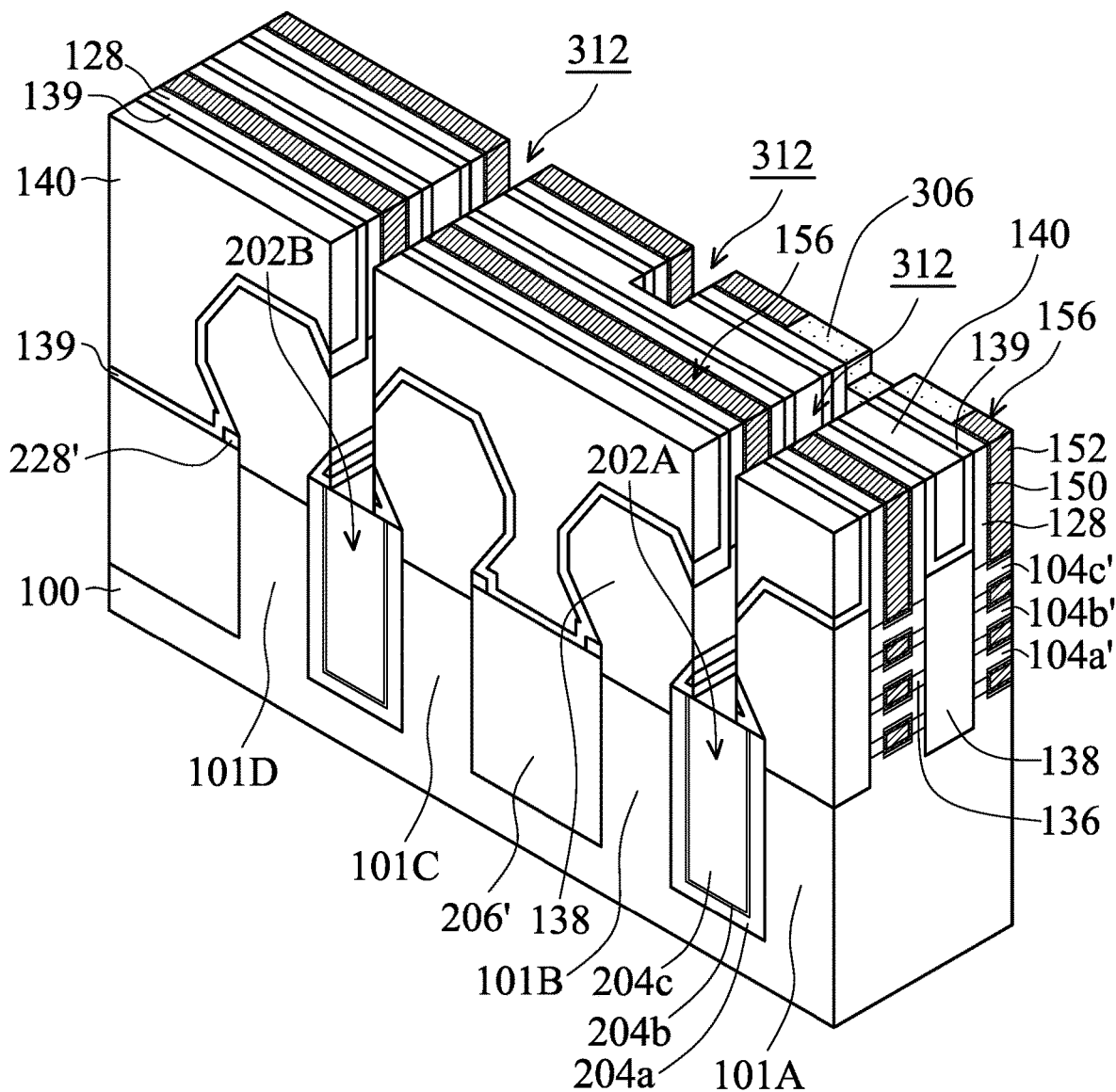
Figure 2N:
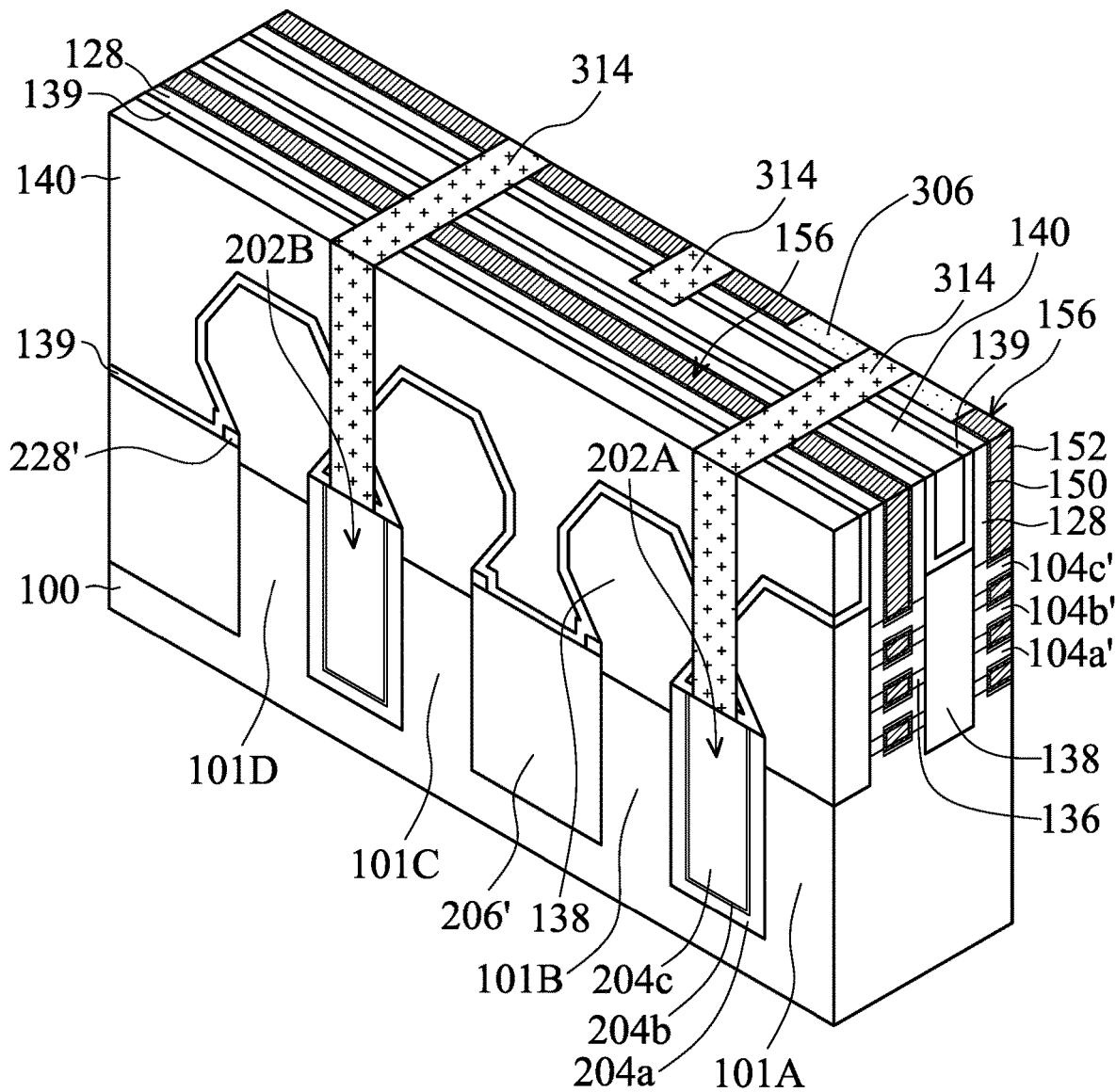

FIGS. 2A-2N are perspective views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, a semiconductor stack having multiple semiconductor layers is formed over the semiconductor substrate 100. In some embodiments, the semiconductor stack includes multiple semiconductor layers 102a, 102b, 102c, and 102d. The semiconductor stack also includes multiple semiconductor layers 104a, 104b, and 104c. In some embodiments, the semiconductor layers 102a-102d and the semiconductor layers 104a-104c are laid out alternately. The semiconductor layers 102a-102d and the semiconductor layers 104a-104c have an alternating configuration.

In some embodiments, the semiconductor layers 102a-102c function as sacrificial layers that will be removed in a subsequent process to release the semiconductor layers 104a-104c. The semiconductor layers 104a-104c that are released may function as channel structures of one or more transistors. In some embodiments, the semiconductor layer 102d functions as a sacrificial planarization stop layer. In some embodiments, the semiconductor layer 102d is thinner than each of the semiconductor layers 102a-102c.

In some embodiments, the semiconductor layers 104a-104c are used to form channel structures. The semiconductor layers 104a-104c may be made of a material that is different than that of the semiconductor layers 102a-102d. In some embodiments, the semiconductor layers 104a-104c are made of or include silicon, germanium, one or more other suitable materials, or a combination thereof. In some embodiments, the semiconductor layers 102a-102d are made of or include silicon germanium. In some other embodiments, the semiconductor layers 104a-104c are made of silicon germanium, and the semiconductor layers 102a-102d are made of silicon germanium with different atomic concentration of germanium than that of the semiconductor layers 104a-104c. As a result, different etching selectivity and/or different oxidation rates during subsequent processing may be achieved between the semiconductor layers 102a-102d and the semiconductor layers 104a-104c.

The present disclosure contemplates that the semiconductor layers 102a-102d and the semiconductor layers 104a-104c include any combination of semiconductor materials that can provide desired etching selectivity, desired oxidation rate differences, and/or desired performance characteristics (e.g., materials that maximize current flow).

In some embodiments, the semiconductor layers 102a-102d and 104a-104c are formed using multiple epitaxial growth operations. Each of the semiconductor layers 102a-102d and 104a-104c may be formed using a selective epitaxial growth (SEG) process, a chemical vapor deposition (CVD) process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the semiconductor layers 102a-102d and 104a-104c are grown in-situ in the same process chamber. In some embodiments, the growth of the semiconductor layers 102a-102d and 104a-104c are alternately and sequentially performed in the same process chamber to complete the formation of the semiconductor stack. In some embodiments, the vacuum of the process chamber is not broken before the epitaxial growth of the semiconductor stack is accomplished.

Afterwards, a hard mask element is formed over the semiconductor stack to assist in a subsequent patterning of the semiconductor stack. The hard mask element may include a first mask layer 108 and a second mask layer 110. The first mask layer 108 and the second mask layer 110 may be made of different materials. In some embodiments, the first mask layer 108 is made of an oxide material such as silicon oxide, and the second mask layer 110 is made of a nitride material such as silicon nitride.

As shown in FIG. 2B, the semiconductor stack is patterned to form multiple fin structures including fin structures 106A, 106B, 106C, and 106D, in accordance with some embodiments. One or more photolithography processes and one or more etching processes are used to partially remove the semiconductor stack, so as to form the fin structures 106A-106D, as shown in FIG. 2B.

The semiconductor stack may be patterned to form the fin structures 106A-106D by any suitable method. For example, the fin structures 106A-106D may be formed using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

Each of the fin structures 106A-106D may include portions of the semiconductor layers 102a-102d and 104a-104c and multiple semiconductor fins including semiconductor fins 101A-101D, as shown in FIG. 2B. The semiconductor substrate 100 may also be partially removed during the etching process that forms the fin structures 106A-106D. Protruding portions of the semiconductor substrate 100 that remain form the semiconductor fins 101A-101D, as shown in FIG. 2B.

FIGS. 1A-1E are top views of various stages of a process for forming a portion of a semiconductor device structure, in accordance with some embodiments. As shown in FIG. 1A, multiple fin structures 106A-106D are formed, in accordance with some embodiments. In some embodiments, the fin structures 106A-106D are oriented lengthwise. In some embodiments, the extending directions of the fin structures 106A-106D are substantially parallel to each other, as shown in FIG. 1A. In some embodiments, FIG. 1A shows the top view of the structure shown in FIG. 2B. For clarity, some elements are not shown in FIGS. 1A-1E.

As shown in FIGS. 1A and 2B, the fin structures 106A and 106B are separated from each other by a distance S1, the fin structures 106C and 106D are separated from each other by a distance S2, and the fin structures 106B and 106C are separated from each other by a distance S3. In some embodiments, the distance S1 is substantially equal to the distance S2. In some embodiments, the distance S3 is greater than each of the distances S1 and S2. The distance S1 or S2 may be within a range from about 20 nm to about 40 nm. The distance S3 may be within a range from about 40 nm to about 60 nm.

Figure 1B:
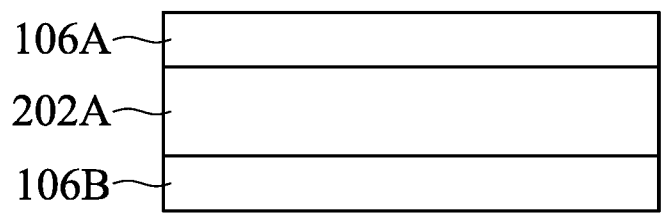
Figure 1B:
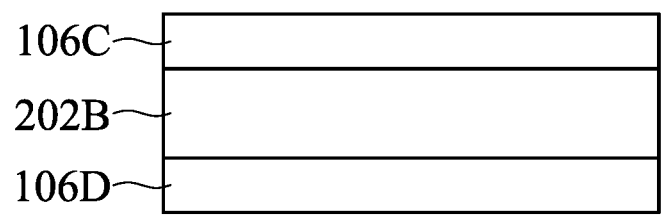

As shown in FIGS. 1B and 2C, an isolation structure 202A is formed between the fin structures 106A and 106B, and an isolation structure 202B is formed between the fin structures 106C and 106D, in accordance with some embodiments. The isolation structures 202A and 202B may be used as forksheet isolation walls that enable space reduction and device performance boost.

In some embodiments, each of the isolation structures 202A and 202B has multiple sub-layers. As shown in FIG. 2C, each of the isolation structures 202A and 202B has a first dielectric layer 204a, a second dielectric layer 204c, and an etch stop layer 204b that is between the first dielectric layer 204a and the second dielectric layer 204c. In some other embodiments, the etch stop layer 204b is not formed. In some other embodiments, the first dielectric layer 204a and the etch stop layer 204b are not formed. Each of the isolation structures 202A and 202B has a single layer structure.

The first dielectric layer 204a may be made of or include SiN, SiCN, SiOC, SiOCN, one or more other suitable materials, or a combination thereof. The second dielectric layer 204c may be made of or include SiN, SiCN, SiOC, SiOCN, one or more other suitable materials, or a combination thereof. In some embodiments, the first dielectric layer 204a and the second dielectric layer 204c are made of different materials. For example, the first dielectric layer 204a is made of or includes SiN and/or SiCN, and the second dielectric layer 204c is made of or includes SiOC and/or SiOCN. In some embodiments, the etch stop layer 204b is made of or includes an oxide material such as silicon oxide.

However, embodiments of the disclosure are not limited thereto. Many variations and/or modifications can be made to embodiments of the disclosure. In some other embodiments, the first dielectric layer 204a and the second dielectric layer 204c are made of the same material.

In some embodiments, the first dielectric layer 204a is thinner than the second dielectric layer 204c. The first dielectric layer 204a may have a thickness that is within a range from about 2 nm to about 5 nm. The second dielectric layer 204c may have a thickness that is within a range from about 15 nm to about 35 nm. The etch stop layer 204b may have a thickness that is within a range from about 1 nm to about 2 nm.

In some embodiments, the first dielectric layer 204a is deposited over the structure shown in FIG. 2B. The first dielectric layer 204a extends along the top surface of the semiconductor substrate 100. The first dielectric layer 204a further extends along the tops and sidewalls of the fin structures 106A-106D. The first dielectric layer 204a may extend over the structure shown in FIG. 2B in a conformal manner. The first dielectric layer 204a may be deposited using a chemical vapor deposition (CVD) process, an atomic layer deposition (ALD) process, one or more other applicable processes, or a combination thereof.

Afterwards, the etch stop layer 204b is deposited over the first dielectric layer 204a. The etch stop layer 204b may be deposited using a CVD process, an ALD process, one or more other applicable processes, or a combination thereof. The second dielectric layer 204c is then deposited over the etch stop layer 204b. The second dielectric layer 204c may be deposited using a chemical vapor deposition (CVD) process, an atomic layer deposition (ALD) process, one or more other applicable processes, or a combination thereof.

In some embodiments, one or more etching back processes are used to partially remove the deposited layers 204a-204c. The portions of the deposited layers 204a-204c between the fin structures 106C and 106B may be thinner and be etched at a greater rate since the distance between the fin structures 106C and 106 is larger. As a result, after the etching back process, the portions of the deposited layers 204a-204c between the fin structures 106C and 106B may be completely removed. As a result, the remaining portions of these layers form the isolation structures 202A and 202B.

However, embodiments of the disclosure are not limited thereto. In some other embodiments, one or more photolithography processes and one or more etching processes are used to pattern the deposited layers 204a-204c. As a result, the isolation structures 202A and 202B are formed.

Afterwards, a dielectric layer 206 is deposited over the fin structures 106A-106D and the isolation structures 202A and 202B, as shown in FIG. 2D in accordance with some embodiments. The dielectric layer 206 may be a single layer or include multiple sub-layers.3 The dielectric layer 206 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layer 206 may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layer 206. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof.

Afterwards, another planarization process (such as a CMP process) may be performed to remove the hard mask elements (including the first mask layer 108 and the second mask layer 110). The semiconductor layer 102d may function as a stop layer of the planarization process. Then, one or more etching back processes are used to partially remove the dielectric layer 206. As a result, the remaining portion of the dielectric layer 206 forms an isolation feature 214. Upper portions of the fin structures 106A-106D protrude from the top surface of the isolation feature 206', as shown in FIG. 2E in accordance with some embodiments.

In some embodiments, the etching back process for forming the isolation feature 206' is carefully controlled to ensure that the topmost surface of the isolation feature 206' is positioned at a suitable height level, as shown in FIG. 2E. In some embodiments, the topmost surface of the isolation feature 206' is below the bottommost surface of the semiconductor layer 102a that functions as a sacrificial layer.

Figure 1C:
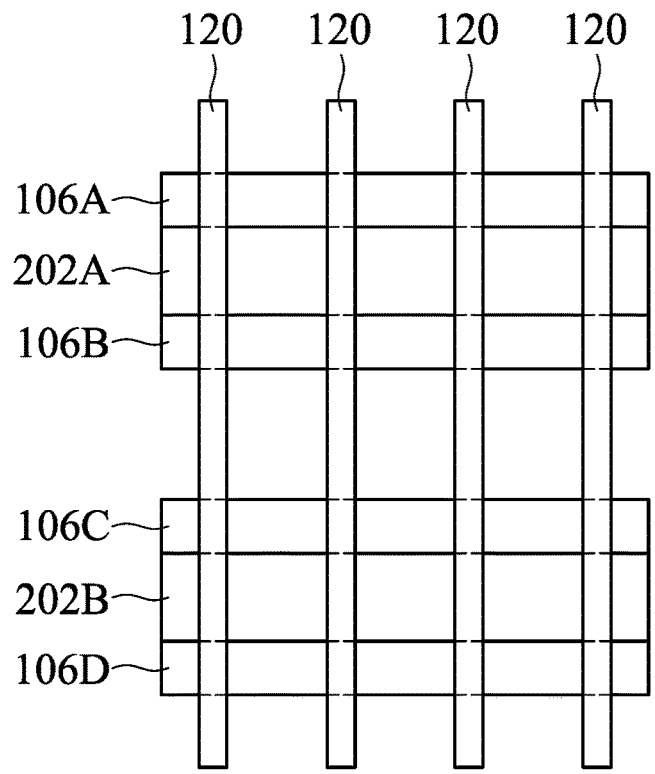

As shown in FIGS. 1C and 2F, dummy gate stacks 120 are formed in such a way that they extend across, and are wrapped around, the fin structures 106A-106D and the isolation structures 202A-202B, in accordance with some embodiments. As shown in FIGS. 1C and 2F, some portions of the fin structures 106A-106D and the isolation structures 202A-202B are exposed without being covered by the dummy gate stacks 120.

As shown in FIG. 2F, each of the dummy gate stacks 120 includes a dummy gate dielectric layer 116 and a dummy gate electrode 118. The dummy gate dielectric layer 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation feature 206', the fin structures 106A-106D, and the isolation structures 202A-202B. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120.

In some embodiments, hard mask elements including mask layers 122 and 124 are used to assist in the patterning process for forming the dummy gate stacks 120. The mask layers 122 and 124 may be made of different materials. In some embodiments, the mask layer 122 is made of a nitride material such as silicon nitride, and the mask layer 124 is made of an oxide material such as silicon oxide. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120.

As shown in FIG. 2G, spacer elements 128 are formed over the sidewalls of the dummy gate stacks 120, in accordance with some embodiments. In some embodiments, the spacer elements are also formed over the sidewalls of the fin structures 106A-106D that are not adjacent to the isolation structures 202A-202B.

In some embodiments, one or more spacer layers are deposited over the dummy gate stacks 120, the fin structures 106A-106D, and the isolation structures 202A-202B. The spacer layers may be made of or include silicon carbide, silicon oxycarbide, carbon-containing silicon oxynitride, silicon oxide, silicon nitride, one or more other suitable materials, or a combination thereof. The spacer layers may be sequentially deposited using a CVD process, an ALD process, a physical vapor deposition (PVD) process, one or more other applicable processes, or a combination thereof.

Afterwards, the spacer layers are partially removed, in accordance with some embodiments. One or more anisotropic etching processes may be used to partially remove the spacer layers. The portions of the spacer layers on the tops of the fin structures 106A-106D, the isolation structures 202A-202B, and the isolation feature 206' are removed. As a result, the remaining portions of the spacer layers form the spacer elements 128, as shown in FIG. 2G.

As shown in FIG. 2H, the fin structures 106A-106D are partially removed, in accordance with some embodiments. The portions of the fin structures 106A-106D not covered by the dummy gate stacks 120 are recessed. As a result, the recesses 130 are formed, as shown in FIG. 2H. The recesses 130 may be used to contain epitaxial structures (such as source/drain structures) that will be formed later.

One or more etching processes may be used to form the recesses 130. In some embodiments, a dry etching process is used to form the recesses 130. Alternatively, a wet etching process may be used to form the recesses 130. In some embodiments, the recesses 130 penetrate into the fin structure 106A. In some embodiments, the recesses 130 further extend into the semiconductor fins 101A-101D, as shown in FIG. 2H.

In some embodiments, the isolation structures 202A-202B and the spacer elements 128 are also partially removed during the formation of the recesses 130, as shown in FIG. 2H. In some embodiments, the spacer elements 128 that extend along the exposed sidewalls of the fin structures 106A-106D are recessed, and the remaining portion of these spacer elements 128 form support elements 228'. The support elements 228' and the portions of the isolation structures 202A-202B beside the recesses 130 may be used to assist in the subsequent formation of the epitaxial structures. The support elements 228' and the isolation structures 202A-202B may together confine the growth of the epitaxial structures, so as to form the epitaxial structures with desired profiles.

As shown in FIG. 2I, the semiconductor layers 102a-102d are recessed, and inner spacers 136 are then formed to cover the remaining portions of the semiconductor layers 102a-102d, in accordance with some embodiments. In some embodiments, the semiconductor layers 102a-102d are laterally etched. As a result, edges of the semiconductor layers 102a-102d retreat from edges of the semiconductor layers 104a-104c, as shown in FIG. 2I. Recesses are thus formed due to the lateral etching of the semiconductor layers 102a-102d. The recesses are used to contain the inner spacers 136 to be formed. The semiconductor layers 102a-102d may be laterally etched using a wet etching process, a dry etching process, or a combination thereof. In some other embodiments, the semiconductor layers 102a-102d are partially oxidized before being laterally etched.

In some embodiments, an insulating layer is deposited to overfill the recesses. In some embodiments, the insulating layer is a single layer. In some other embodiments, the insulating layer includes multiple sub-layers. Some of the sub-layers may be made of different materials and/or contain different compositions.

The insulating layer may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. The insulating layer may be deposited using a CVD process, an ALD process, one or more other applicable processes, or a combination thereof.

Afterwards, an etching process is used to partially remove the insulating layer, in accordance with some embodiments. The portions of the insulating layer outside of the recesses may be removed. The remaining portions of the insulating layer form the inner spacers 136, as shown in FIG. 2I. The etching process may include a dry etching process, a wet etching process, or a combination thereof.

The inner spacers 136 7021c4z7 over the edges of the semiconductor layers 102a-102d. The inner spacers 136 may be used to prevent subsequently formed epitaxial structures (that function as, for example, source/drain structures) from being damaged during a subsequent process for removing the sacrificial layers 102a-102d. The inner spacers 136 may also help to hold the nanostructures that will be formed later.

In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fins 101A-101D previously covered by the insulating layer are exposed by the recesses 130, as shown in FIG. 2I. The edges of the semiconductor layers 104a-104c are also exposed by the recesses 130, as shown in FIG. 2I.

As shown in FIG. 2J, epitaxial structures 138 are formed, in accordance with some embodiments. In some other embodiments, the epitaxial structures 138 overfill the recesses 130 to ensure full contact between the epitaxial structures 138 and the semiconductor layers 104c. In some embodiments, the top surfaces of the epitaxial structures 138 are higher than the top surface of the dummy gate dielectric layer 116. In some other embodiments, the epitaxial structures 138 partially fill the recesses 130.

The support elements 228' and the isolation structures 202A-202B may be used to confine the formation of the epitaxial structures 138. As a result, the epitaxial structures 138 that have desired profile and size are formed.

In some embodiments, the epitaxial structures 138 connect to the semiconductor layers 104a-104c. Portions of the semiconductor layers 104a-104c that will be function as channel structures are sandwiched between two respective epitaxial structures 138, as shown in FIG. 2J. In some embodiments, some of the epitaxial structures 138 are designed to function as source/drain structures of p-channel field-effect transistors (PFET). The epitaxial structures 138 may include epitaxially grown silicon germanium (SiGe), epitaxially grown silicon, or another suitable epitaxially grown semiconductor material. In some embodiments, the epitaxial structures 138 are doped with one or more suitable p-type dopants. For example, the epitaxial structures 138 are SiGe source/drain features or SI source/drain features that are doped with boron (B), gallium (Ga), indium (In), or another suitable dopant.

In some other embodiments, some of the epitaxial structures 138 are designed to function as source/drain structures of n-channel field-effect transistors (NFET). The epitaxial structures 138 may include epitaxially grown silicon or another suitable epitaxially grown semiconductor material. The epitaxial structures 138 are n-type doped. In some embodiments, the epitaxial structures 138 are doped with one or more suitable n-type dopants. For example, the epitaxial structures 138 are SI source/drain features that are doped with phosphor (P), antimony (Sb), arsenic (As), or another suitable dopant.

The term "source/drain structure" may refer to a source structure or a drain structure, individually or collectively, depending on the context.

In some embodiments, the epitaxial structures 138 are formed using multiple epitaxial growth operations. In some embodiments, these epitaxial growth operations are performed in-situ in the same process chamber. In some embodiments, the vacuum of the process chamber is not broken before the formation of the epitaxial structures 138 is accomplished. The reaction gases may be varied in the reaction chamber during the epitaxial growth operations.

These epitaxial growth operations may be achieved using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138 involves one or more etching processes that are used to fine-tune the shapes of the epitaxial structures 138.

In some embodiments, the epitaxial structures 138 are doped in-situ during their epitaxial growth. The initial reaction gas mixture for forming the epitaxial structures 138 contains respective dopants. In some embodiments, the epitaxial structures 138 are further exposed to one or more annealing processes to activate the dopants. For example, a rapid thermal annealing process is used. During the one or more annealing processes, the sacrificial structure 210' remains stable.

In some embodiments, the epitaxial structures 138 formed on the semiconductor fins 101A and 101B are p-type doped, and the epitaxial structures 138 formed on the semiconductor fins 101C and 101D are n-type doped. The p-typed doped epitaxial structures and the n-type doped epitaxial structures may be formed separately. Patterned mask elements may be formed to assist in the formation of the epitaxial structures 138 on the desired regions.

Many variations and/or modifications can be made to embodiments of the disclosure. In some other embodiments, the epitaxial structures 138 formed on the semiconductor fins 101A and 101B are n-type doped, and the epitaxial structures 138 formed on the semiconductor fins 101C and 101D are p-type doped. In some other embodiments, the epitaxial structures 138 formed on the semiconductor fins 101B and 101C are p-type doped, and the epitaxial structures 138 formed on the semiconductor fins 101A and 101D are n-type doped. In some other embodiments, the epitaxial structures 138 formed on the semiconductor fins 101B and 101C are n-type doped, and the epitaxial structures 138 formed on the semiconductor fins 101A and 101D are p-type doped.

Afterwards, as shown in FIG. 2K, a contact etch stop layer 139 and a dielectric layer 140 are formed to cover the epitaxial structures 138 and to surround the dummy gate stacks 120, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 2K. The planarization process may include a CMP process, a grinding process, an etching process, a dry polishing process, one or more other applicable processes, or a combination thereof.

In some embodiments, the mask layers 122 and 124 over the dummy gate stacks 120 are partially removed or completely during the planarization process. In some embodiments, after the planarization process, one or more etching processes are used to remove the remaining portions of the mask layers 122 and 124.

Figure 3A:
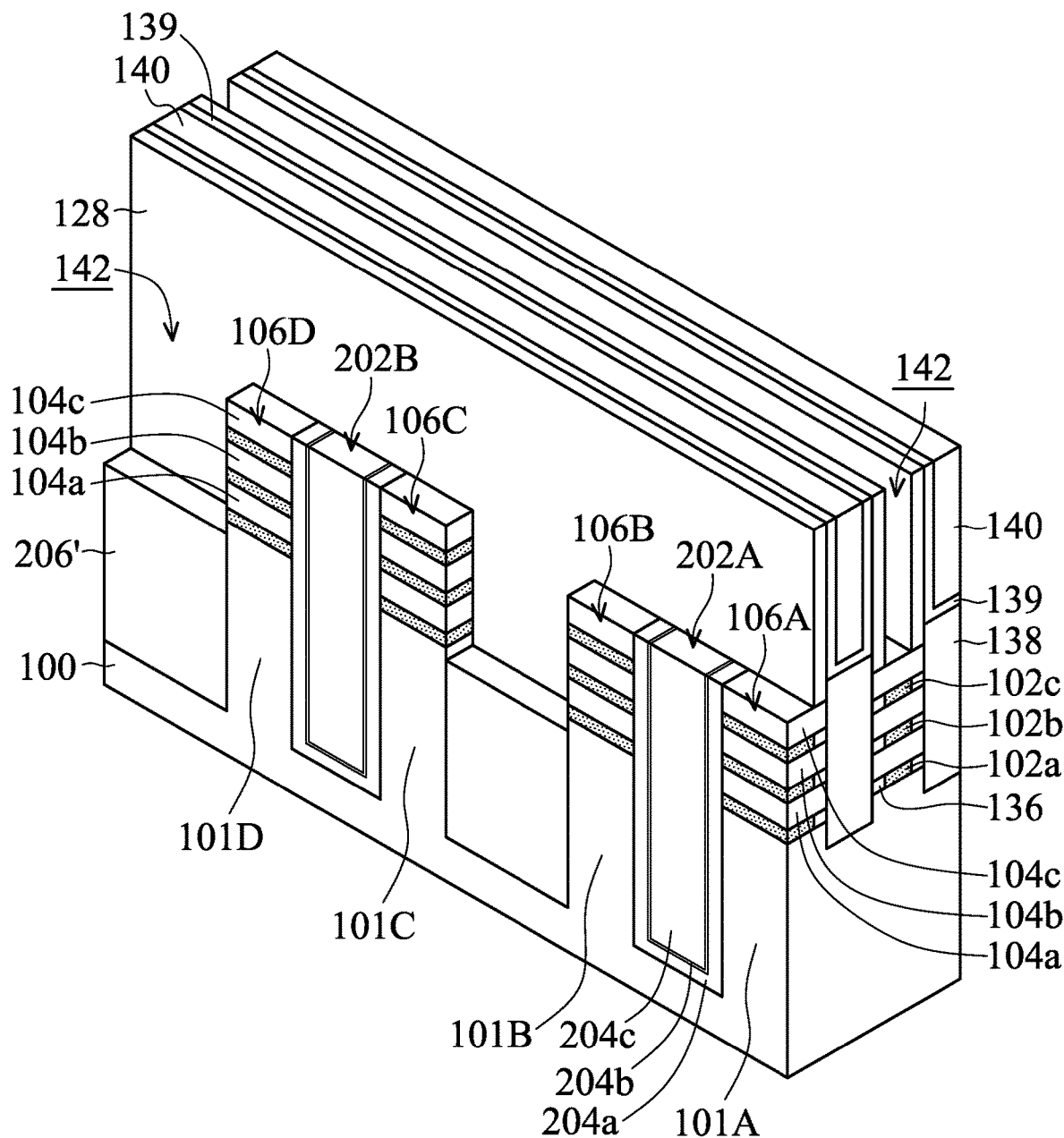
FIGS. 3A-3I are perspective views of various stages of a process for forming a portion of a semiconductor device structure, in accordance with some embodiments.

Afterwards, the dummy gate stacks 120 are removed to form trenches 142. FIGS. 3A-3I are perspective views of various stages of a process for forming a portion of a semiconductor device structure, in accordance with some embodiments. FIGS. 3A and 2L may show the same structure. FIG. 3A has a better disclosure of the structures formed inside the trenches 142.

As shown in FIGS. 2L and 3A, the dummy gate stacks 120 are removed to form the trenches 142, in accordance with some embodiments. One or more etching processes may be used to form the trenches 142. The trenches 142 are surrounded by the dielectric layer 140. The trenches 142 expose the isolation feature 206', the fin structures 106A-106D, and the isolation structures 202A-202B that are previously covered by the dummy gate stacks 120.

Figure 3B:
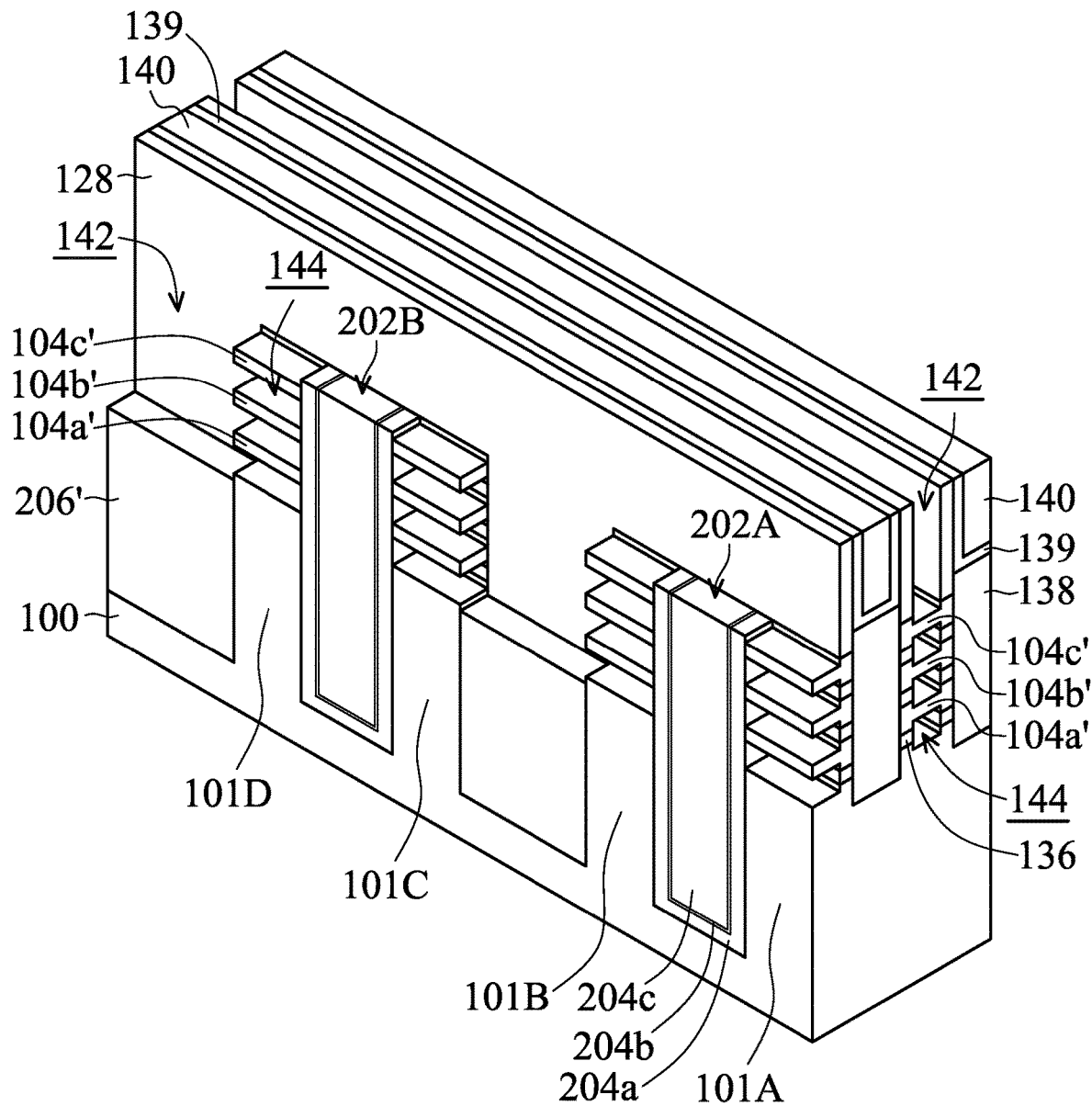

As shown in FIG. 3B, the semiconductor layers 102a-102c (that function as sacrificial layers) are removed, in accordance with some embodiments. In some embodiments, one or more etching processes are used to remove the semiconductor layers 102a-102c. As a result, recesses 144 are formed, as shown in FIG. 3B.

Due to their high etching selectivity, the semiconductor layers 104a-104c are slightly (or substantially not) etched. The remaining portions of the semiconductor layers 104a-104c form multiple semiconductor nanostructures 104a'-104c'. The semiconductor nanostructures 104a'-104c' are constructed by or made up of the remaining portions of the semiconductor layers 104a-104c. The semiconductor nanostructures 104a'-104c' may function as channel structures of transistors.

In some embodiments, the etchant used for removing the semiconductor layers 102a-102c also slightly removes the semiconductor layers 104a-104c that form the semiconductor nanostructures 104a'-104c'. As a result, the obtained semiconductor nanostructures 104a'-104c' become thinner after the removal of the semiconductor layers 102a-102c. In some embodiments, each of the semiconductor nanostructures 104a'-104c' has a thinner inner portion and thicker edge portions. The edge portions are surrounded by other elements and thus are prevented from being reached and etched by the etchant.

After the removal of the semiconductor layers 102a-102c (that function as sacrificial layers), the recesses 144 are formed. The recesses 144 connect to the trench 142 and surround each of the semiconductor nanostructures 104a'-104c'. As shown in FIG. 3B, even if the recesses 144 between the semiconductor nanostructures 104a'-104c' are formed, the semiconductor nanostructures 104a'-104c' remain held by the epitaxial structures 138 and the inner spacers 136. Therefore, after the removal of the semiconductor layers 102a-102c (that function as sacrificial layers), the released semiconductor nanostructures 104a'-104c' are prevented from falling.

During the removal of the semiconductor layers 102a-102c (that function as sacrificial layers), the inner spacers 136 protect the epitaxial structures 138 from being etched or damaged. The quality and reliability of the semiconductor device structure are improved.

Figure 3C:
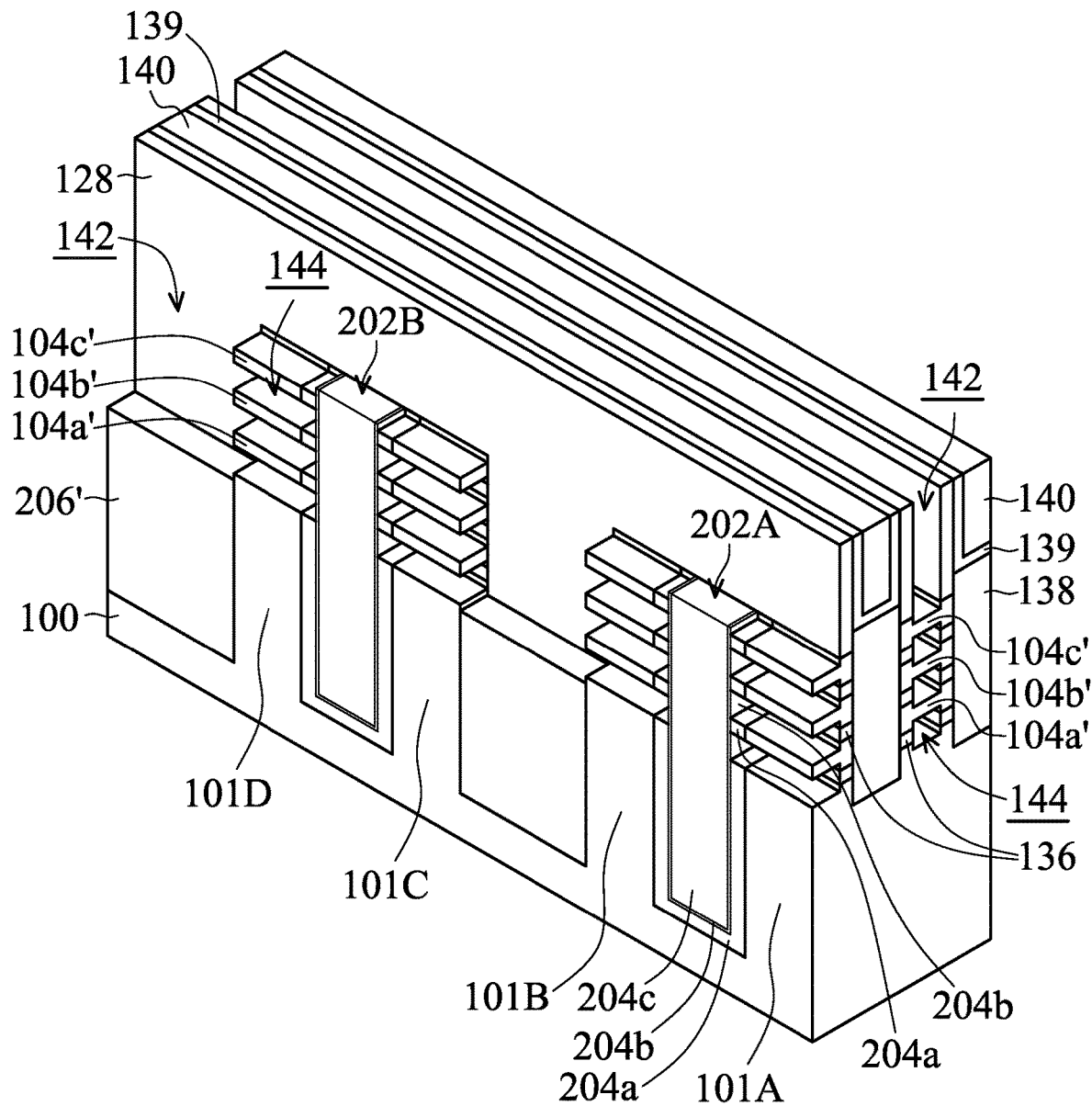

As shown in FIG. 3C, the isolation structures 202A and 202B are trimmed, in accordance with some embodiments. An etching process may be used to remove the exposed portions of the first dielectric layer 204a. As a result, the isolation structures 202A and 202B are recessed, exposing the etch stop layer 204b. In some embodiments, the etching process involves lateral etch of the first dielectric layer 204a and slight vertical etch of the first dielectric layer 204. As a result, each of the recesses 144 further extends towards the isolation structure 202A or 202B. The recessed isolation structures 202A and 202B allow the subsequently formed metal gate stacks cover more portions of the semiconductor nanostructures 104a'-104c', which leads to improved performance of the semiconductor device structure.

Figure 3D:
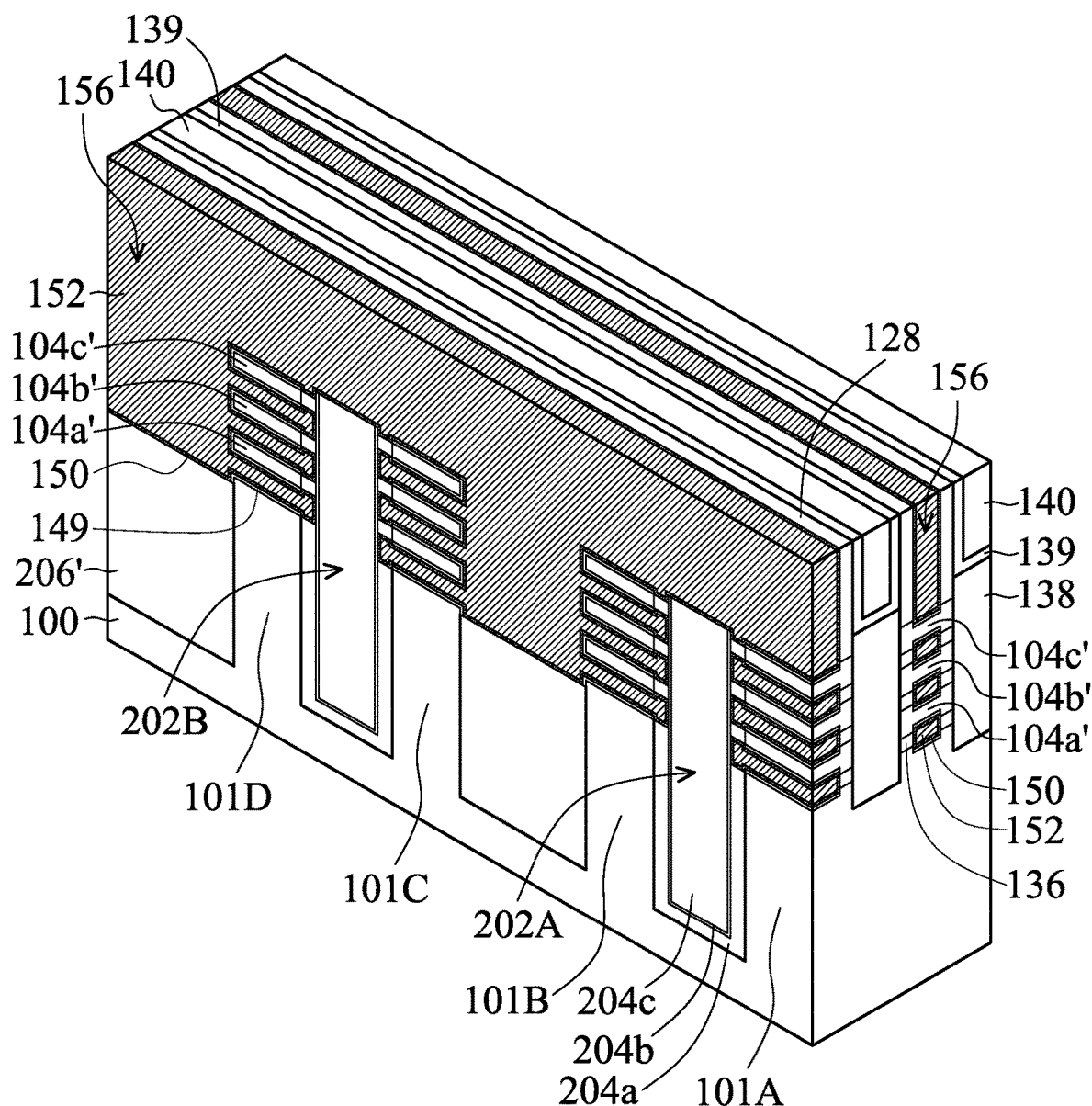

As shown in FIG. 3D, metal gate stacks 156 are formed to fill the trenches 142, in accordance with some embodiments. The metal gate stacks 156 further extend into the recesses 144. As a result, the metal gate stacks 156 are wrapped around the semiconductor nanostructures 104a'-104c'.

Each of the metal gate stacks 156 includes multiple metal gate stack layers. Each of the metal gate stacks 156 may include a gate dielectric layer 150 and a metal gate electrode 152. The metal gate electrode 152 may include one or more work function layers. The metal gate electrode 152 may further include a conductive filling. In some embodiments, the formation of the metal gate stacks 156 involves the deposition of multiple metal gate stack layers over the dielectric layer 140 to fill the trenches 142 and the recesses 144. The metal gate stack layers extend into the recesses 144 and are wrapped around each of the semiconductor nanostructures 104a'-104c'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof. The formation of the gate dielectric layer 150 may further involve one or more thermal operations.

In some embodiments, before the formation of the gate dielectric layer 150, interfacial layers 149 are formed on the surfaces of the semiconductor nanostructures 104a'-104c' and the semiconductor fins 101A-101D. The interfacial layers 149 are very thin and are made of silicon oxide or germanium oxide, for example.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value that is suitable for the device, which may be equal to or greater than about 4.8 eV.

The p-type work function layer may include metal, metal carbide, metal nitride, one or more other suitable materials, or a combination thereof. For example, the p-type metal includes tantalum nitride, tungsten nitride, titanium, titanium nitride, one or more other suitable materials, or a combination thereof.

In some embodiments, the work function layer is used for forming an NMOS device. The work function layer is an n-type work function layer. The n-type work function layer is capable of providing a work function value that is suitable for the device, which may be equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof. In some embodiments, the formation of the work function layer involves one or more patterning processes. As a result, the p-type work function layer and the n-type work function layer are selectively formed over respective regions.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152 are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156, as shown in FIG. 3D.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144, especially for the lower recesses 144 that may have larger space.

Figure 4:
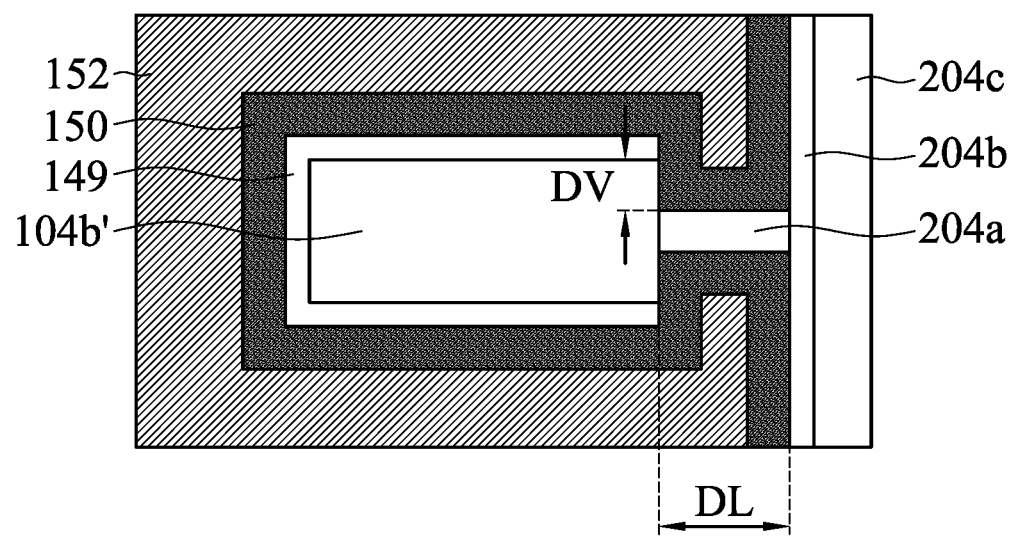
FIG. 4 is a cross-sectional view of a portion of a semiconductor device structure, in accordance with some embodiments.

FIG. 4 is a cross-sectional view of a portion of a semiconductor device structure, in accordance with some embodiments. In some embodiments, FIG. 4 shows the cross-sectional view of the structure near the recessed isolation structure 202A or 202B. In some embodiments, the isolation structures 202A and 202B are partially removed, as shown in FIG. 3C. Therefore, the metal gate electrode 152 of the metal gate stack 156 is allowed to have a lateral extension DL extending towards the etch stop layer 204b of the isolation structure 202A or 202B. The metal gate electrode 152 of the metal gate stack 156 also has a vertical extension DV extending towards the remaining portion of the first dielectric layer 204a. The metal gate electrode 152 may thus be wrapped around the semiconductor nanostructures 104a'-104c' in a better manner, which allows a better short channel effect (SCE) control. The distance of the lateral extension DL may be within a range from about 3 nm to about 5 nm, and the distance of the vertical extension DV may be within a range from about 1 nm to about 2 nm.

Figure 5:
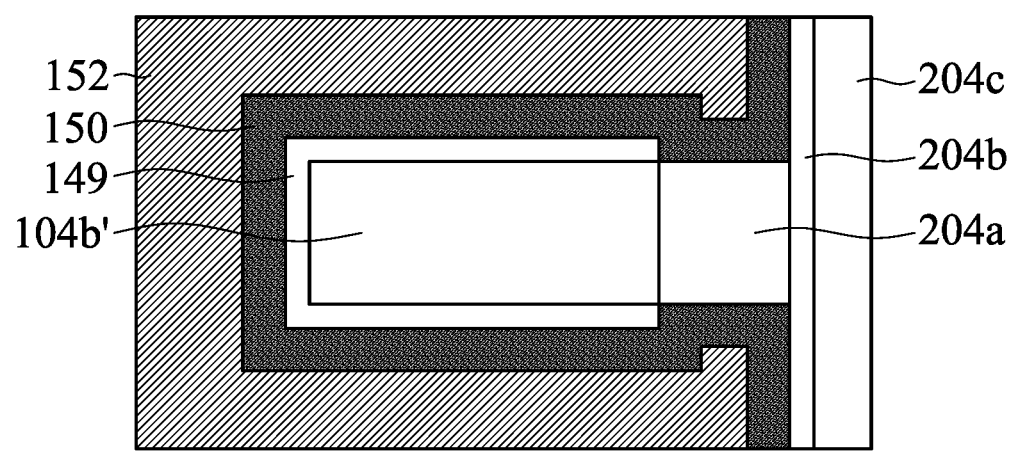
FIG. 5 is a cross-sectional view of a portion of a semiconductor device structure, in accordance with some embodiments.

However, embodiments of the disclosure are not limited thereto. Many variations and/or modifications can be made to embodiments of the disclosure. Many variations and/or modifications can be made to embodiments of the disclosure. FIG. 5 is a cross-sectional view of a portion of a semiconductor device structure, in accordance with some embodiments. In some embodiments, the distance of the vertical extension of the metal gate stack 156 is substantially equal to zero. The lateral extension DL and the vertical extension DV may be adjusted by fine-tuning the partial removal of the isolation structures 202A-202B as illustrated in FIG. 3C.

Figure 3E:
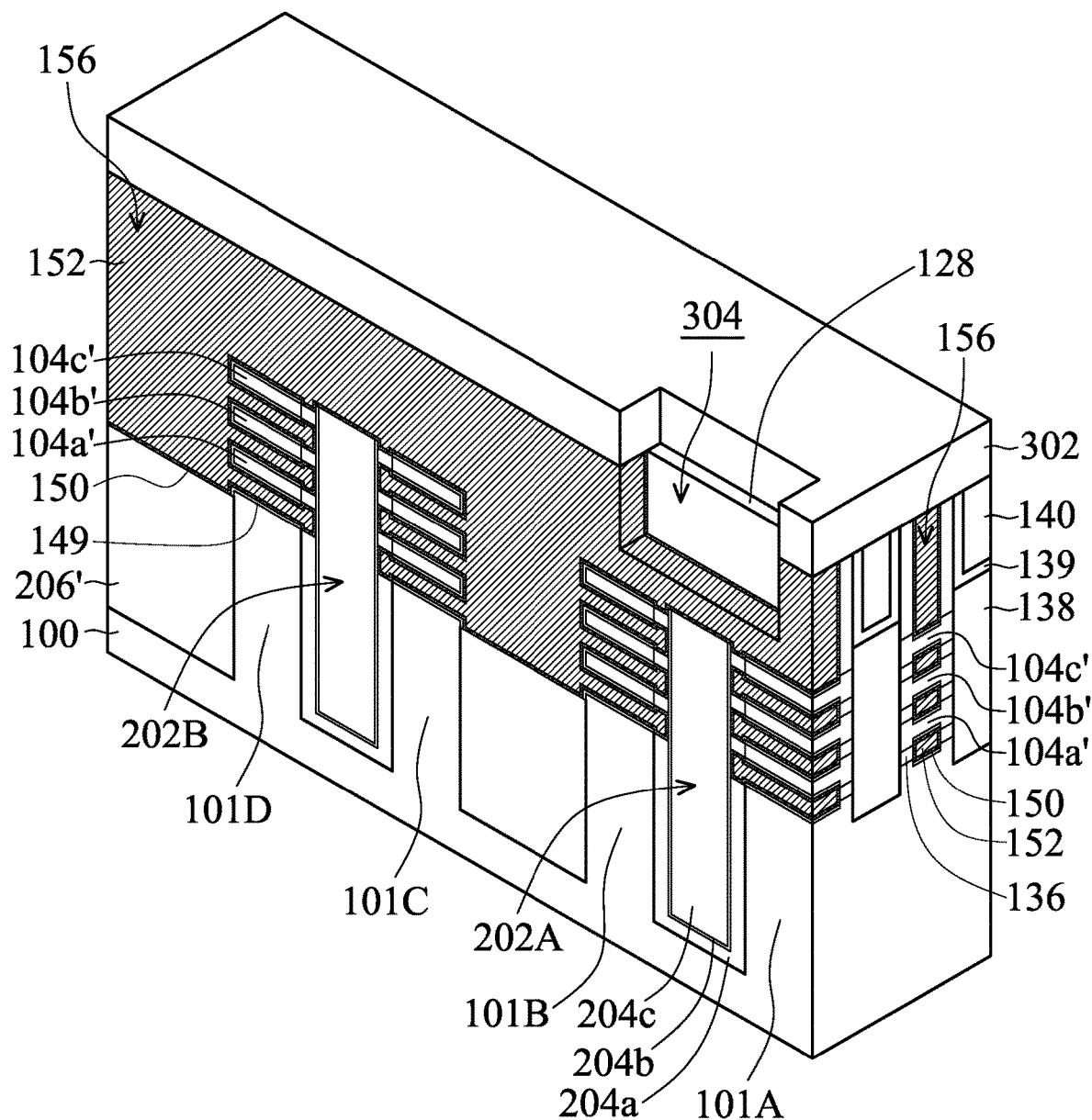

Afterwards, as shown in FIG. 3E, a patterned mask element 302 is formed over the structure shown in FIG. 3D. The patterned mask element 302 has an opening that exposes the position where a protective structure is to be formed. Afterwards, one or more etching processes are used to partially remove the metal gate stack 156. As a result, a recess 304 that extends into the metal gate stack 156 is formed, as shown in FIG. 3E. The recess 304 may be used to contain a protective structure that will be formed later.

Figure 1D:
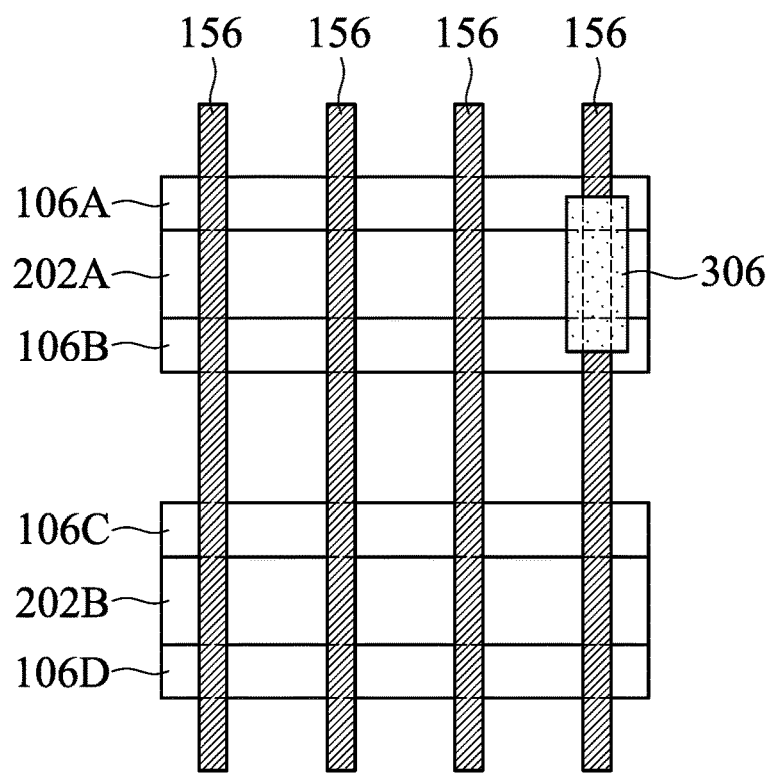
Figure 3F:
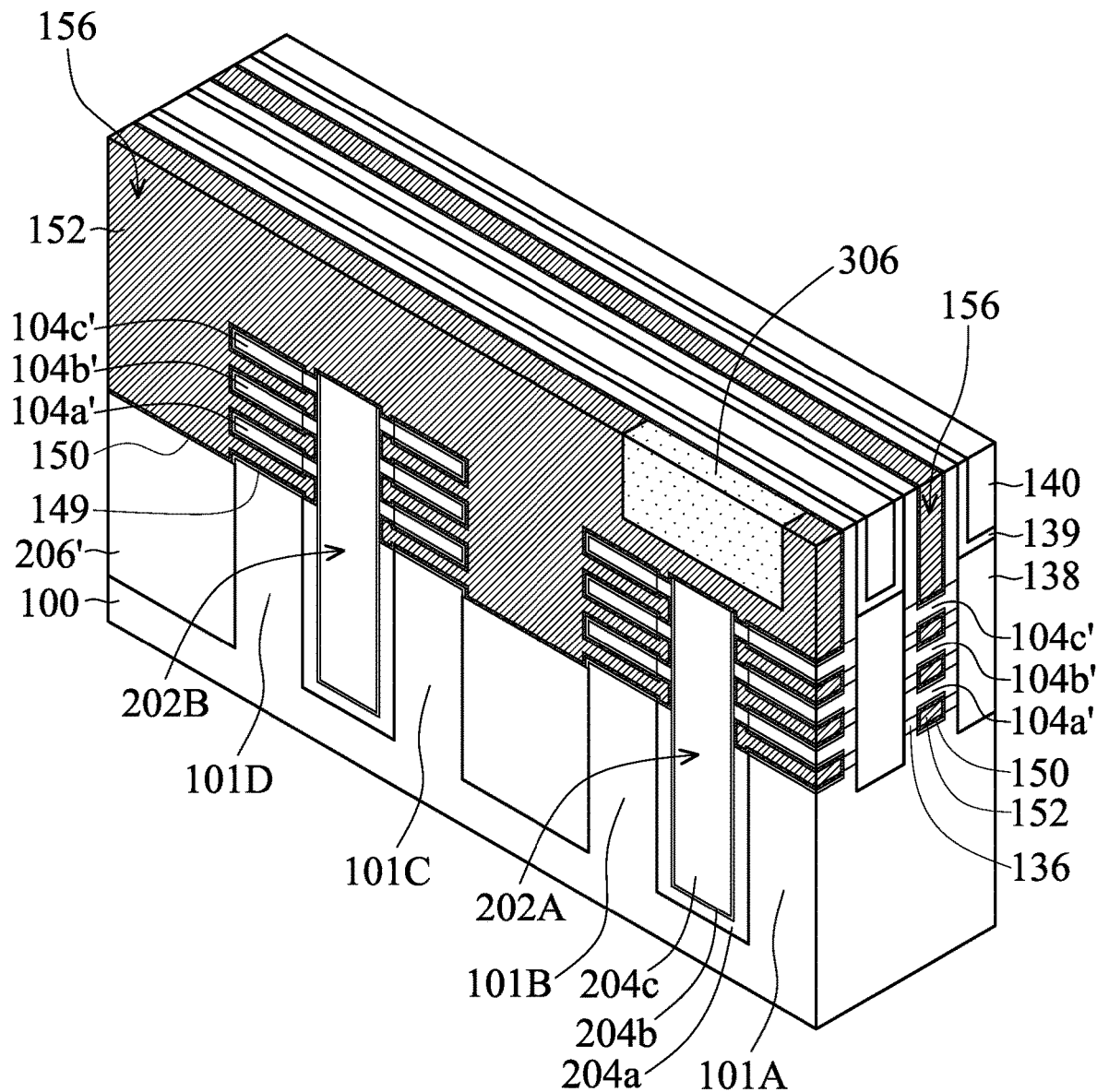

As shown in FIGS. 1D and 3F, a protective structure 306 is formed, in accordance with some embodiments. In some embodiments, the protective structure 306 fills the recess 304 and is embedded in the metal gate stack 156. In some embodiments, the protective structure 306 extends across opposite sidewalls of the isolation structure 202A, as shown in FIGS. 1D and 3F. In some embodiments, the protective structure 306 further partially overlaps the semiconductor nanostructures 104a'-104c' formed above the semiconductor fins 101A and 101B, as shown in FIGS. 1D and 3F.

The protective structure 306 may be made of or include SiN, SiCN, one or more other suitable materials, or a combination thereof. The protective structure 306 may have a width that is within a range from about 20 nm to about 60 nm. The protective structure 306 may have a thickness that is within a range from about 5 nm to about 30 nm.

In some embodiments, a protective material layer is deposited over the metal gate stack 156 to overfill the recess 304. The protective material layer may be deposited using a CVD process, an ALD process, one or more other applicable processes, or a combination thereof. Afterwards, a planarization process is used to remove the portion of the protective material layer outside of the recess 304. As a result, the remaining portion of the protective material layer forms the protective structure 306. The planarization process may include a CMP process, a grinding process, an etching process, one or more other applicable processes, or a combination thereof.

Figure 3G:
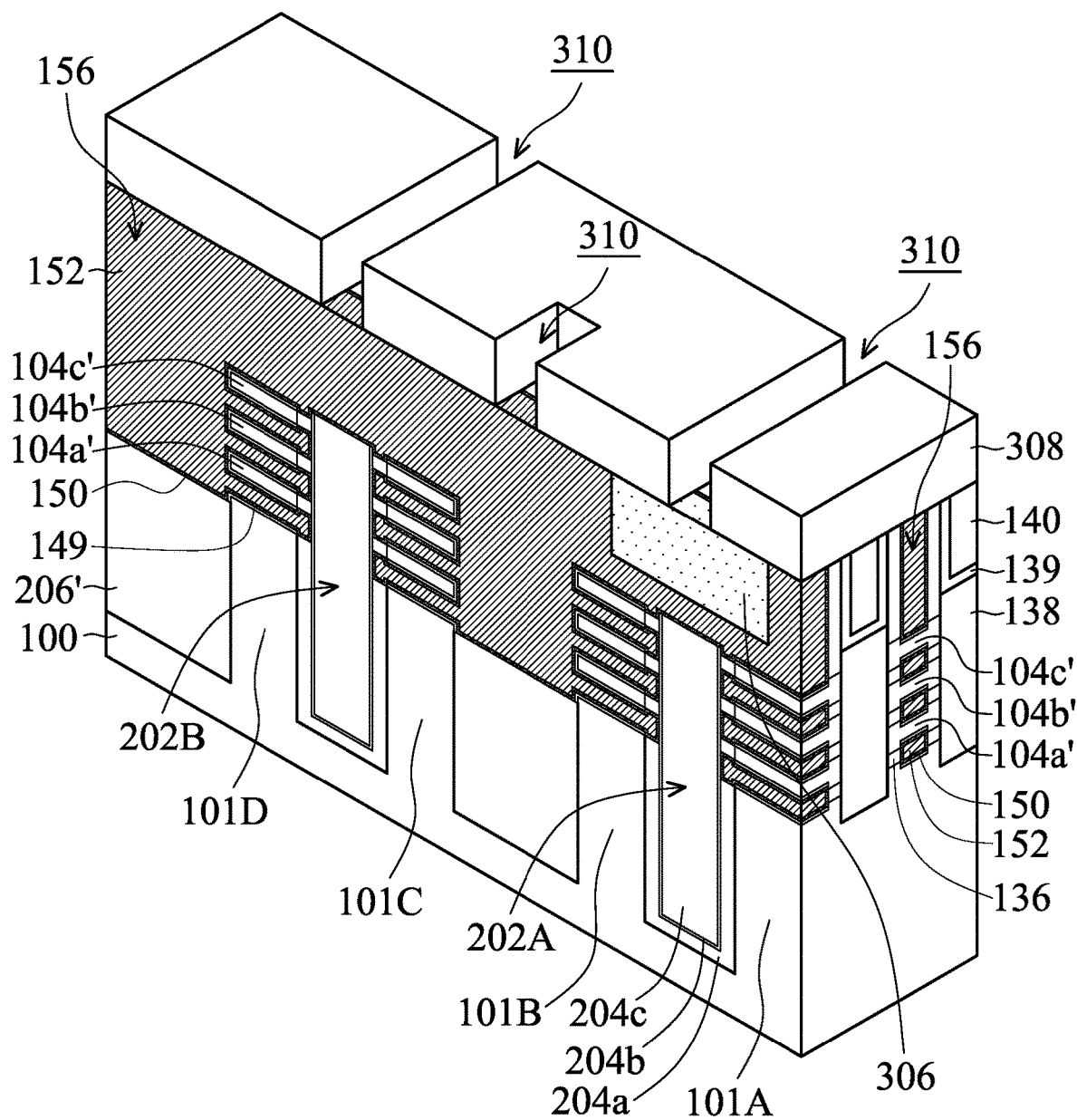

As shown in FIG. 3G, a patterned mask element 308 is formed over the structure shown in FIG. 3F, in accordance with some embodiments. The patterned mask element 308 has multiple openings 310. The openings 310 partially expose the metal gate stacks 156, the protective structure 306, and the dielectric layer 140. The openings 310 define the positions where dielectric structures are to be formed. The dielectric structures may be used to cut through the metal gate stacks 156 and/or the epitaxial structures 138.

Figure 3H:
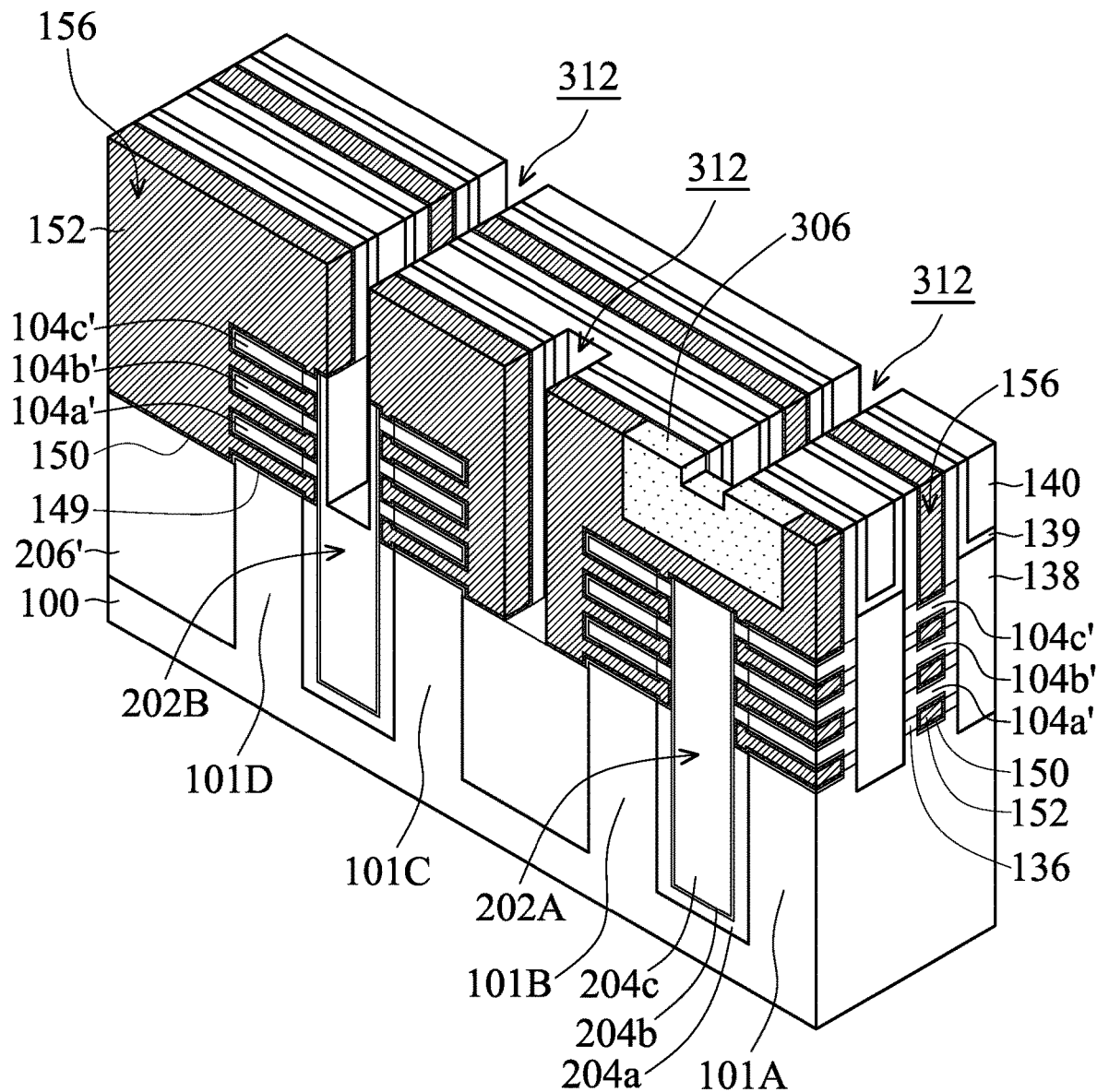

Afterwards, with the patterned mask element 308 as an etching mask, one or more etching processes are used to partially remove the structures under the openings 310. As a result, multiple trenches 312 are formed, as shown in FIGS. 2M and 3H in accordance with some embodiments. The trenches 312 cut through portions of the metal gate stacks 156, portions of the epitaxial structures 138, and portions of the dielectric layer 140. The metal gate stacks 156 may thus be separated into multiple portions that are electrically isolated from each other, so as to meet the circuit design requirements. The nearby epitaxial structures 138 may thus be separated from each other to prevent them from being merged together. In some embodiments, the trenches 312 extend into the isolation structures 202A and 202B, as shown in FIGS. 2M and 3H.

As shown in FIGS. 2M and 3H, the protective structure 306 prevents the metal gate stack 156 thereunder from being etched. The trench 312 does not cut through the portion of the metal gate stack 156 under the protective structure 306. The portions of the metal gate stack 156 beside the protective structure 306 are electrically connected to each other. The protective structure 306 helps to achieve local connection of the metal gate stack 156.

As shown in FIGS. 2M and 3H, the etching processes used for forming the trenches 312 also partially remove the protective structure 306, in accordance with some embodiments. As a result, the protective structure 306 is recessed, as shown in FIGS. 2M and 3H.

Figure 1E:
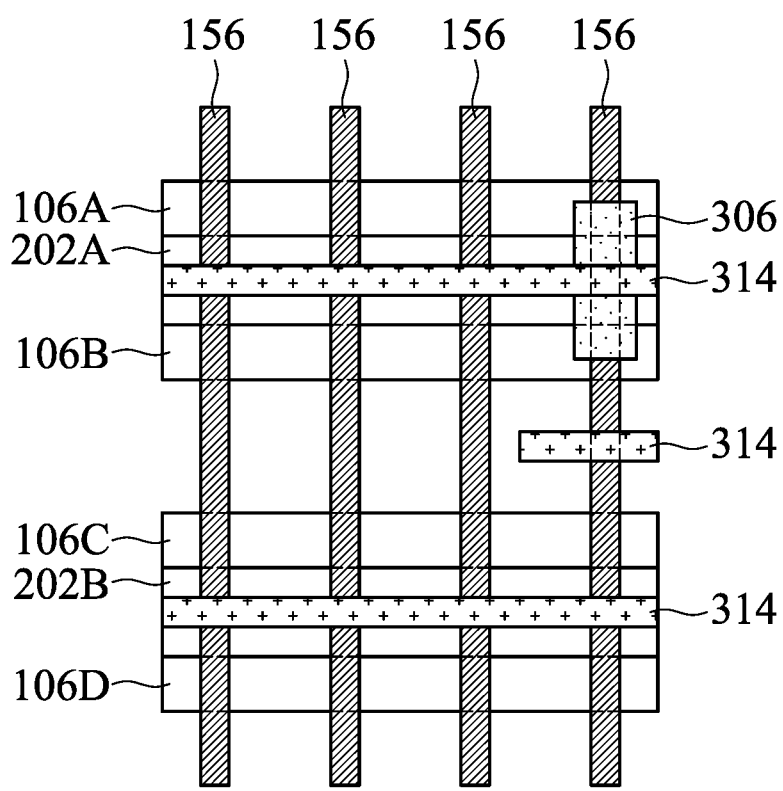
Figure 3I:
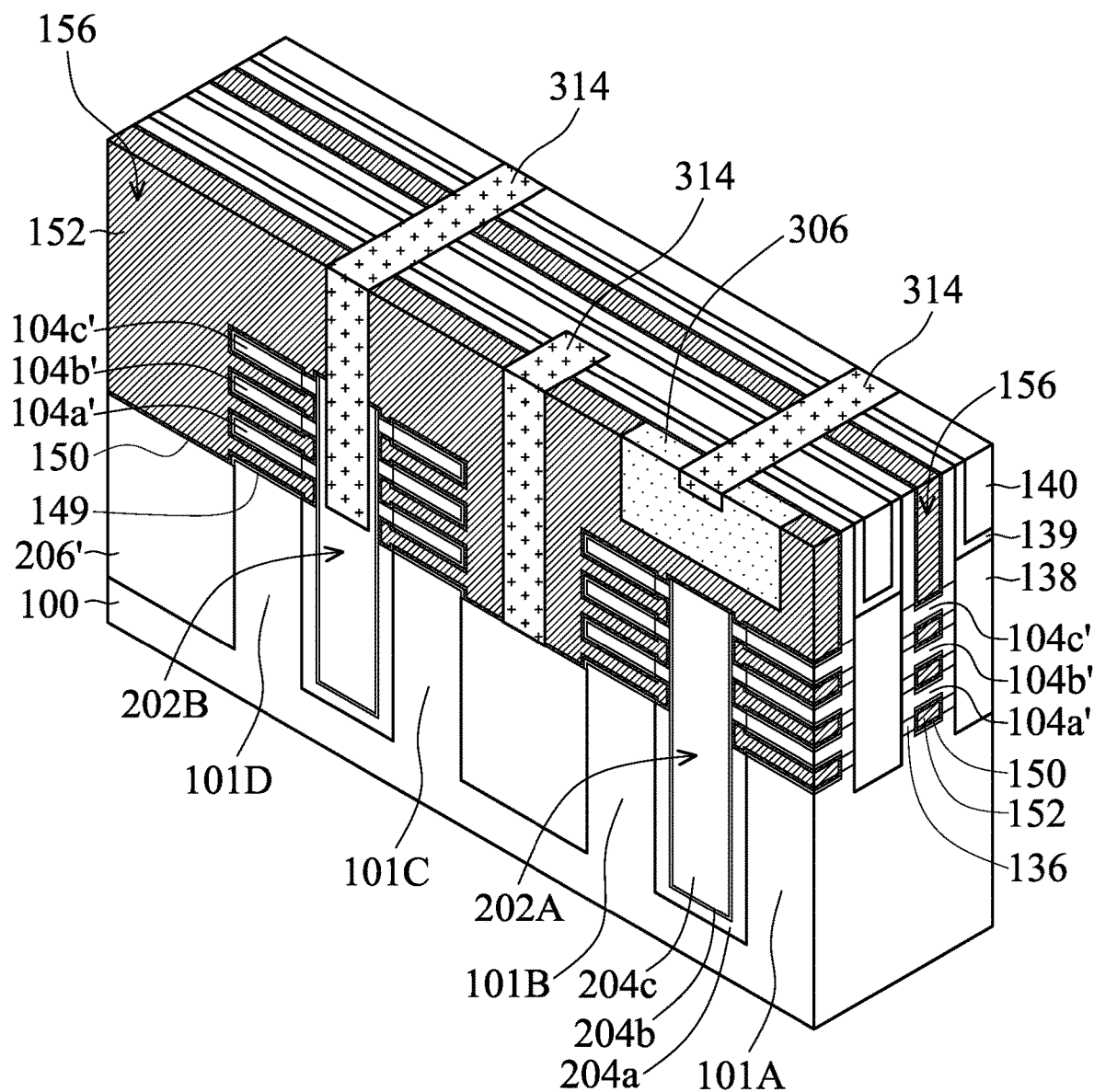

Afterwards, as shown in FIGS. 1E, 2N, and 3I, multiple dielectric structures 314 are formed, in accordance with some embodiments. The dielectric structures 314 may be used to achieve the electrical isolation between nearby portions of the metal gate stacks 156 and the electrical isolation between nearby epitaxial structures 138. In some embodiments, the dielectric structures 314 are made of a dielectric material that is substantially free of oxygen. In some embodiments, the dielectric structures 314 are in direct contact with the metal gate stacks 156 and/or the epitaxial structures 138. The dielectric structures 314 may be made of or include SiN, SiCN, one or more other suitable materials, or a combination thereof.

In some embodiments, since the dielectric structures 314 are substantially free of oxygen, the metal gate stacks and the epitaxial structures 138 may thus be prevented from being oxidized. The quality and the reliability of the semiconductor device structure are improved.

In some embodiments, a dielectric material layer is deposited to overfill the trenches 312. The dielectric material layer may be deposited using a CVD process, an FCVD process, an ALD process, one or more other applicable processes, or a combination thereof. Afterwards, a planarization process is used to remove the portion of the protective material layer outside of the trenches 312. As a result, the remaining portion of the dielectric material layer forms the dielectric structures 314. The planarization process may include a CMP process, a grinding process, an etching process, one or more other applicable processes, or a combination thereof.

In some embodiments, the dielectric structure 314 penetrates through the metal gate stack 156 and reaches the isolation feature 206', as shown in FIG. 3I. In some embodiments, the dielectric structure 314 is in direct contact with the isolation feature 206'. The dielectric structure 314 cut the metal gate stack 156 into separated portions that are electrically isolated from each other.

In some embodiments, the dielectric structure 314 extends into the metal gate stack 156 and reaches the isolation structure 202A or 202B, as shown in FIGS. 2N and 3I. The dielectric structure 314 and the isolation structure 202B together cut the metal gate stack 156 into separated portions that are electrically isolated from each other.

In some embodiments, the dielectric structure 314 is in direct contact with the isolation structure 202A or 202B. In some embodiments, the dielectric structure 314 further extends into the isolation structure (such as the isolation structure 202B), as shown in FIG. 3I. The dielectric structure 314 thus has an embedded portion laterally surrounded by the isolation structure 202B. The embedded portion of the dielectric structure 314 may has a height that is within a range from about 1 nm to about 80 nm. In some other embodiments, the dielectric structure 314 is in direct contact with the isolation structure 202A or 202B without further extending into the isolation structure 202A or 202B.

In some embodiments, the dielectric structure 314 extends into the protective structure 306, as shown in FIG. 3I. In some embodiments, a portion of the protective structure 306 is between the dielectric structure 314 and the metal gate stack 156. Due to the protective structure 306, the dielectric structure 314 does not cut through the portion of the metal gate stack 156 under the protective structure 306. In some embodiments, a portion of the metal gate stack 156 is between the protective structure 306 and the isolation structure 202A. In some embodiments, the dielectric structure 314 is in direct contact with the protective structure 306.

In some embodiments, the epitaxial structures 138 respectively formed on the semiconductor fins 101B and 101C are separated from each other by a wider spacing. The epitaxial structures 138 may be electrically isolated from each other by the contact etch stop layer 139 and the dielectric layer 140, as shown in FIG. 2N.

In some embodiments, the epitaxial structures 138 respectively formed on the semiconductor fins 101A and 101B are separated from each other by a narrower spacing. The epitaxial structures 138 may be electrically isolated from each other by the dielectric structure 314, as shown in FIG. 2N. Similarly, the epitaxial structures 138 respectively formed on the semiconductor fins 101C and 101D may be electrically isolated from each other by the dielectric structure 314, as shown in FIG. 2N.

In some embodiments, due to the dielectric structures 314, the epitaxial structures 138 have asymmetric profiles. As shown in FIG. 2N each of the epitaxial structures 138 has a first side and a second side. The first side is between the second side and the dielectric structure 314. As shown in FIG. 2M, the first side of the epitaxial structure 138 is partially removed during the formation of the trenches 312 used to contain the dielectric structure 314. As a result, the epitaxial structures 138 may have the asymmetric profiles. The lateral size of the epitaxial structure 138 at the first side may be smaller than the lateral size of the epitaxial structure 138 at the second side by about 1 nm to about 15 nm.

However, embodiments of the disclosure are not limited thereto. Many variations and/or modifications can be made to embodiments of the disclosure. In some other embodiments, the epitaxial structures 138 are not partially removed during the formation of the trenches 312. In these cases, the epitaxial structures 138 may have substantially symmetric profiles.

Many variations and/or modifications can be made to embodiments of the disclosure. The semiconductor nanostructures may have many applicable profiles. The semiconductor nanostructures may include nanosheets, nanowires, or other suitable nano structures.

As shown in FIGS. 2N and 3I, the sheet number of the GAA device is three. However, embodiments of the disclosure are not limited thereto. Many variations and/or modifications can be made to embodiments of the disclosure. In some other embodiments, the sheet number of the GAA device may be 2, 4, 5, 6, or other suitable number.

Some embodiments relate to the GAA devices. However, embodiments of the disclosure are not limited thereto. Many variations and/or modifications can be made to embodiments of the disclosure. Some other embodiments may relate to planar transistor devices, FinFET devices, one or more other applicable devices, or a combination thereof.

Embodiments of the disclosure form a semiconductor device structure with cut metal gate dielectric structure. A protective structure is embedded in selected region of the metal gate stack before the formation of the cut metal gate dielectric structure. The protective structure may be used to prevent the portion of the metal gate stack thereunder from being cut through by the cut metal gate dielectric structure. Local connection of the metal gate stack may thus be achieved. The reliability and quality of the conductive structure are significantly improved.

In accordance with some embodiments, a method for forming a semiconductor device structure is provided. The method includes forming a first fin structure and a second fin structure over a substrate and forming an isolation structure between the first fin structure and the second fin structure. The method also includes forming a first gate stack wrapped around and extending across the first fin structure, the second fin structure, and the isolation structure. The method further includes forming a second gate stack wrapped around and extending across the first fin structure, the second fin structure, and the isolation structure. In addition, the method includes forming a protective structure extending into the first gate stack, and a portion of the first gate stack is between the protective structure and the isolation structure. The method also includes forming a dielectric structure penetrating into the second gate stack and separating the second gate stack into a first portion and a second portion. The first portion and the second portion are electrically isolated from each other, and the dielectric structure overlaps the protective structure.

In accordance with some embodiments, a method for forming a semiconductor device structure is provided. The method includes forming a first fin structure and a second fin structure over a substrate. The method also includes forming a first metal gate stack wrapped around and extending across the first fin structure and the second fin structure. The method further includes forming a second metal gate stack wrapped around and extending across the first fin structure and the second fin structure. In addition, the method includes forming a protective structure extending into the first gate stack and forming a dielectric structure extending into the protective structure and the second metal gate stack. A portion of the protective structure is between the dielectric structure and the first metal gate stack.

In accordance with some embodiments, a semiconductor device structure is provided. The semiconductor device structure includes a first stack of semiconductor nanostructures and a second stack of semiconductor nanostructures over a substrate. The semiconductor device structure also includes an isolation structure between the first stack of semiconductor nanostructures and the second stack of semiconductor nanostructures. The semiconductor device structure further includes a gate stack wrapped around the isolation structure, the first stack of semiconductor nanostructures, and the second stack of semiconductor nanostructures. In addition, the semiconductor device structure includes a protective structure extending into the gate stack. A portion of the gate stack is between the isolation structure and the protective structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a first fin structure and a second fin structure over a substrate;
   forming an isolation structure between the first fin structure and the second fin structure;
   forming a first gate stack wrapped around and extending across the first fin structure, the second fin structure, and the isolation structure;
   forming a second gate stack wrapped around and extending across the first fin structure, the second fin structure, and the isolation structure;
   forming a protective structure extending into the first gate stack, wherein a portion of the first gate stack is between the protective structure and the isolation structure; and
   forming a dielectric structure penetrating into the second gate stack and separating the second gate stack into a first portion and a second portion, wherein the first portion and the second portion are electrically isolated from each other, and the dielectric structure overlaps the protective structure.

2. The method for forming a semiconductor device structure as claimed in claim 1, wherein each of the first fin structure and the second fin structure has a plurality of semiconductor layers and a plurality of sacrificial layers laid out alternately.

3. The method for forming a semiconductor device structure as claimed in claim 2, further comprising:
   forming a first dummy gate stack wrapped around and extending across the first fin structure, the second fin structure, and the isolation structure;
   forming a second dummy gate stack wrapped around and extending across the first fin structure, the second fin structure, and the isolation structure;
   forming a dielectric layer surrounding the first dummy gate stack and the second dummy gate stack;

removing the first dummy gate stack and the second dummy gate stack to respectively form a first trench and a second trench; and forming the first gate stack and the second gate stack in the first trench and the second trench, respectively.

4. The method for forming a semiconductor device structure as claimed in claim 3, further comprising:

removing the sacrificial layers so that remaining portions the semiconductor layers form a plurality of semiconductor nanostructures after the formation of the first trench and the second trench and before the formation of the first gate stack and the second gate stack.

5. The method for forming a semiconductor device structure as claimed in claim 4, further comprising:

partially removing the isolation structure after the formation of the nanostructures and before the formation of the first gate stack and the second gate stack.

6. The method for forming a semiconductor device structure as claimed in claim 5, wherein:

the isolation structure comprises a first dielectric layer, a second dielectric layer, and an etch stop layer between the first dielectric layer and the second dielectric layer, and the partial removal of the isolation structure comprises etching the first dielectric layer so that the etch stop layer of the isolation structure is exposed.

7. The method for forming a semiconductor device structure as claimed in claim 3, further comprising:

respectively forming a first epitaxial structure a second epitaxial structure on the first fin structure and the second fin structure after the formation of the first dummy gate stack and the second dummy gate stack.

8. The method for forming a semiconductor device structure as claimed in claim 7, further comprising:

partially removing the dielectric layer, the second gate stack, the protective structure, and the isolation structure to form an opening; and filling a dielectric material into the opening to form the dielectric structure.

9. The method for forming a semiconductor device structure as claimed in claim 7, further comprising:

partially removing the dielectric layer, the second gate stack, the protective structure, the isolation structure, and at least one of the first epitaxial structure and the second epitaxial structure to form an opening; and filling a dielectric material into the opening to form the dielectric structure.

10. The method for forming a semiconductor device structure as claimed in claim 1, wherein the dielectric structure extends into the protective structure, and a portion of the protective structure is between the dielectric structure and the first gate stack.

11. A method for forming a semiconductor device structure, comprising:

forming a first fin structure and a second fin structure over a substrate;

forming a first metal gate stack wrapped around and extending across the first fin structure and the second fin structure;

forming a second metal gate stack wrapped around and extending across the first fin structure and the second fin structure;

forming a protective structure extending into the first gate stack; and forming a dielectric structure extending into the protective structure and the second metal gate stack, wherein a portion of the protective structure is between the dielectric structure and the first metal gate stack.

12. The method for forming a semiconductor device structure as claimed in claim 11, further comprising:

forming an isolation structure between the first fin structure and the second fin structure before the formation of the first metal gate stack and the second metal gate stack.

13. The method for forming a semiconductor device structure as claimed in claim 12, wherein the dielectric structure is formed extending through the second metal gate stack and reaching the isolation structure.

14. The method for forming a semiconductor device structure as claimed in claim 12, further comprising:

recessing the isolation structure from sidewalls of the isolation structure.

15. The method for forming a semiconductor device structure as claimed in claim 11, further comprising:

forming a second dielectric structure penetrating into the first metal gate stack and separating the first metal gate stack into a first portion and a second portion, wherein the first portion and the second portion are electrically isolated from each other.

16. A semiconductor device structure, comprising:

a first stack of semiconductor nanostructures and a second stack of semiconductor nanostructures over a substrate;

an isolation structure between the first stack of semiconductor nanostructures and the second stack of semiconductor nanostructures;

a gate stack wrapped around the isolation structure, the first stack of semiconductor nanostructures, and the second stack of semiconductor nanostructures; and a protective structure extending into the gate stack, wherein a portion of the gate stack is between the isolation structure and the protective structure.

17. The semiconductor device structure as claimed in claim 16, further comprising:

a second gate stack wrapped around the isolation structure; and a dielectric structure extending into the second gate stack and reaching the isolation structure.

18. The semiconductor device structure as claimed in claim 17, wherein the dielectric structure extends into the protective structure, and a portion of the protective structure is between the dielectric structure and the gate stack.

19. The semiconductor device structure as claimed in claim 17, wherein the dielectric structure separates the second gate stack into a first portion and a second portion, and the first portion and the second portion are electrically isolated from each other.

20. The semiconductor device structure as claimed in claim 17, further comprising a second dielectric structure extending into the gate stack and extending across an interface between the protective structure and the gate stack.

* * * * *